United States Patent [19]

Kajigaya et al.

[11] Patent Number: 5,539,692
[45] Date of Patent: Jul. 23, 1996

[54] SEMICONDUCTOR MEMORY AND METHOD OF SETTING TYPE

[75] Inventors: Kazuhiko Kajigaya, Iruma; Masashi Horiguchi, Kawasaki; Yoshinobu Nakagome, Hamura; Ryoichi Hori, Hinode-machi; Tetsuro Matsumoto, Higashiyamato; Masaharu Kubo, Hachiouji, all of Japan

[73] Assignee: Hitachi, Ltd., Tokyo, Japan

[21] Appl. No.: 191,411

[22] Filed: Feb. 3, 1994

[30] Foreign Application Priority Data

Feb. 19, 1993 [JP] Japan .................................. 5-055112

[51] Int. Cl.$^6$ .................................................. G11C 7/00
[52] U.S. Cl. ...................... 365/189.01; 365/222; 365/201
[58] Field of Search .............................. 365/201, 189.01, 365/230.01, 226, 222; 437/8

[56] References Cited

U.S. PATENT DOCUMENTS

| | | | |
|---|---|---|---|
| 4,965,768 | 10/1990 | Takeuchi | 365/201 |
| 5,212,652 | 5/1993 | Agrawal et al. | 364/489 |
| 5,249,155 | 9/1993 | Arimoto et al. | 365/226 X |
| 5,343,406 | 8/1994 | Freeman et al. | 364/490 |

*Primary Examiner*—Joseph A. Popek
*Attorney, Agent, or Firm*—Fay, Sharpe, Beall, Fagan, Minnich & McKee

[57] ABSTRACT

A semiconductor chip is provided with a function selection circuit for selecting memory functions according to the information stored in nonvolatile memory elements is sealed in a package, and the memory functions are set finally by writing the nonvolatile memory element in that state or in a state in which the semiconductor chip is mounted on a board. By setting the type of a semiconductor memory according to the above procedure, the process from the wafer process up to the assembling step can be made common, and hence the mass-productibity and the production control can be facilitated. Semiconductor memories having memory functions conforming to user specifications can be provided in a short time.

15 Claims, 17 Drawing Sheets

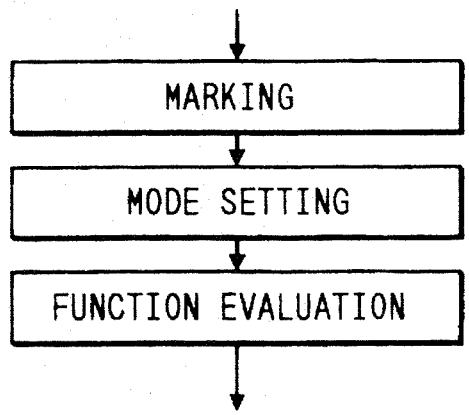
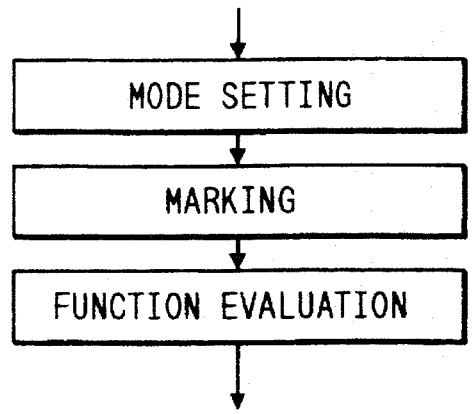
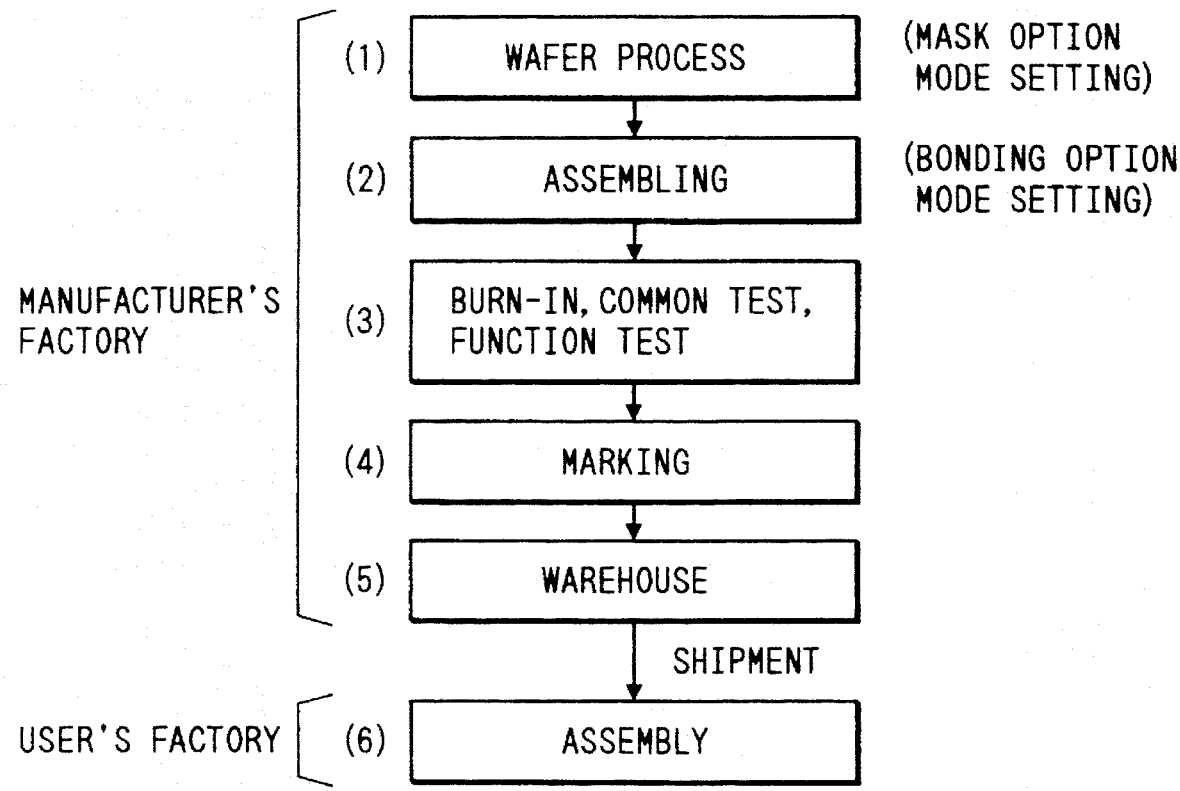

FIG. 5A
8M × 8

| Pin | Signal | Pin | Signal |
|---|---|---|---|
| 1 | VCC | 34 | VSS |
| 2 | DO0 | 33 | DO7 |
| 3 | DO1 | 32 | DO6 |
| 4 | DO2 | 31 | DO5 |
| 5 | DO3 | 30 | DO4 |
| 6 | NC | 29 | VSS |
| 7 | VCC | 28 | /CE |
| 8 | /W | 27 | /G |
| 9 | /RE | 26 | NC |
| 10 | NC | 25 | A12/NC |
| 11 | A0 | 24 | A11 |
| 12 | A1 | 23 | A10 |
| 13 | A2 | 22 | A9 |
| 14 | A3 | 21 | A8 |
| 15 | A4 | 20 | A7 |
| 16 | A5 | 19 | A6 |
| 17 | VCC | 18 | VSS |

SOJ/TSOP TYPE II
500mil × 875mil
1.27mm LEAD PITCH

FIG. 5B
16M × 4

| Pin | Signal | Pin | Signal |
|---|---|---|---|
| 1 | VCC | 34 | VSS |
| 2 | DO0 | 33 | DO3 |
| 3 | DO1 | 32 | DO2 |
| 4 | NC | 31 | NC |
| 5 | NC | 30 | NC |
| 6 | NC | 29 | NC |
| 7 | NC | 28 | /CE |
| 8 | /W | 27 | /G |
| 9 | /RE | 26 | NC |
| 10 | NC | 25 | A12 |
| 11 | A0 | 24 | A11 |
| 12 | A1 | 23 | A10 |
| 13 | A2 | 22 | A9 |
| 14 | A3 | 21 | A8 |
| 15 | A4 | 20 | A7 |
| 16 | A5 | 19 | A6 |
| 17 | VCC | 18 | VSS |

SOJ/TSOP TYPE II
500mil × 875mil
1.27mm LEAD PITCH

FIG. 5C
64M × 1

| Pin | Signal | Pin | Signal |
|---|---|---|---|
| 1 | VCC | 34 | VSS |
| 2 | D | 33 | O |
| 3 | NC | 32 | NC |
| 4 | NC | 31 | NC |
| 5 | NC | 30 | NC |
| 6 | NC | 29 | NC |
| 7 | NC | 28 | /CE |
| 8 | /W | 27 | /G |
| 9 | /RE | 26 | NC |
| 10 | NC | 25 | A12 |
| 11 | A0 | 24 | A11 |
| 12 | A1 | 23 | A10 |
| 13 | A2 | 22 | A9 |
| 14 | A3 | 21 | A8 |
| 15 | A4 | 20 | A7 |
| 16 | A5 | 19 | A6 |
| 17 | VCC | 18 | VSS |

SOJ/TSOP TYPE II
500mil × 875mil
1.27mm LEAD PITCH

| MODE \ ADDRESS | MODE SETTING / MODE SELECTION | | MODE SELECTION | | |
|---|---|---|---|---|---|
| | A0 | A1 | A2 | A3 | A4 |
| ×1 FP | 1 | 1 | 0 | 0 | 0 |
| ×1 SC | 1 | 1 | 1 | 0 | 0 |
| ×4 FP | 1 | 1 | 0 | 1 | 0 |
| ×4 SC | 1 | 1 | 1 | 1 | 0 |
| ×8 FP | 1 | 1 | 0 | 0 | 1 |
| ×8 SC | 1 | 1 | 1 | 0 | 1 |

FP ··· HIGH-SPEED PAGE MODE
SC ··· STATIC COLUMN MODE (MODE DECISION CIRCUIT)

(MODE SETTING CIRCUIT)

(MAJORITY LOGIC)

(BIT-CONFIGURATION ALTERATION CIRCUIT)

(MODE SETTING CIRCUIT)

COMMONLY USED FOR A12/OEB

COMMONLY USED FOR A12/DQ2

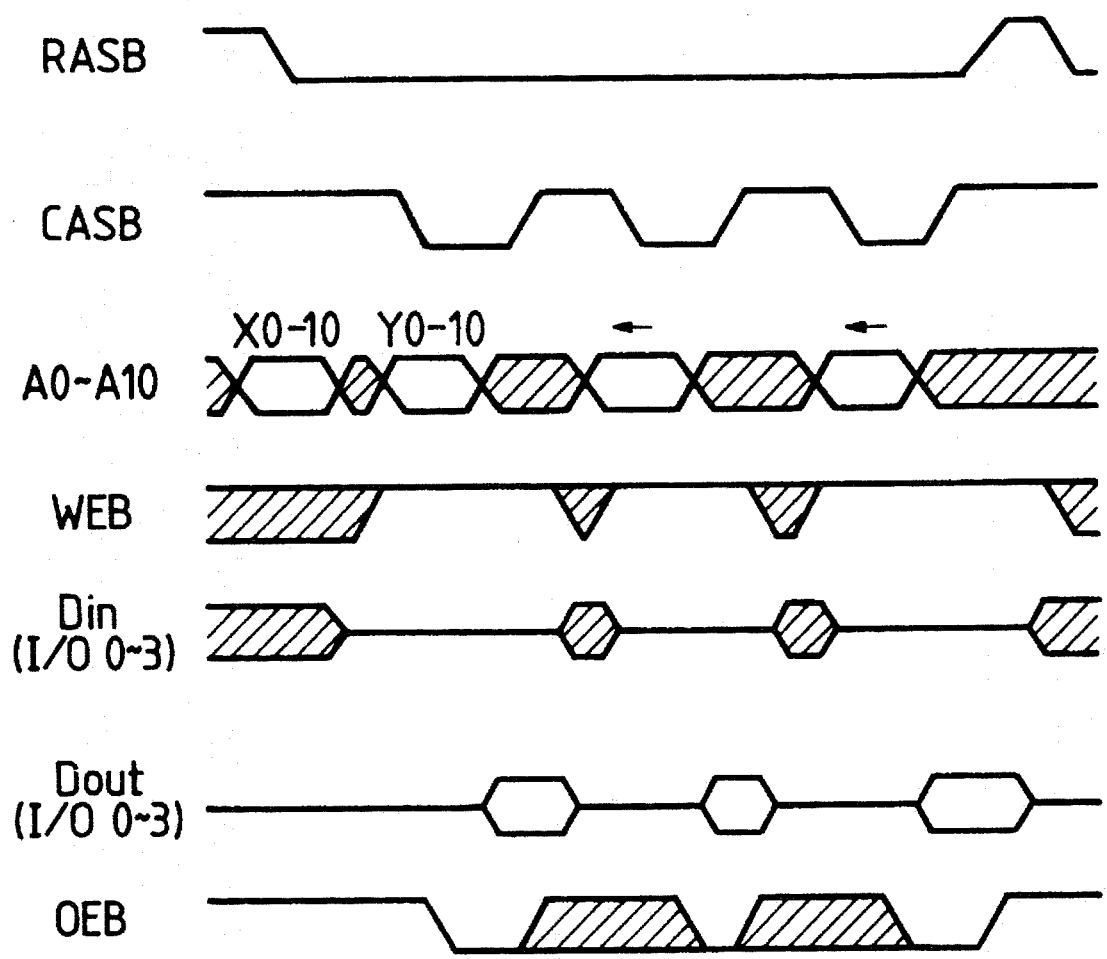

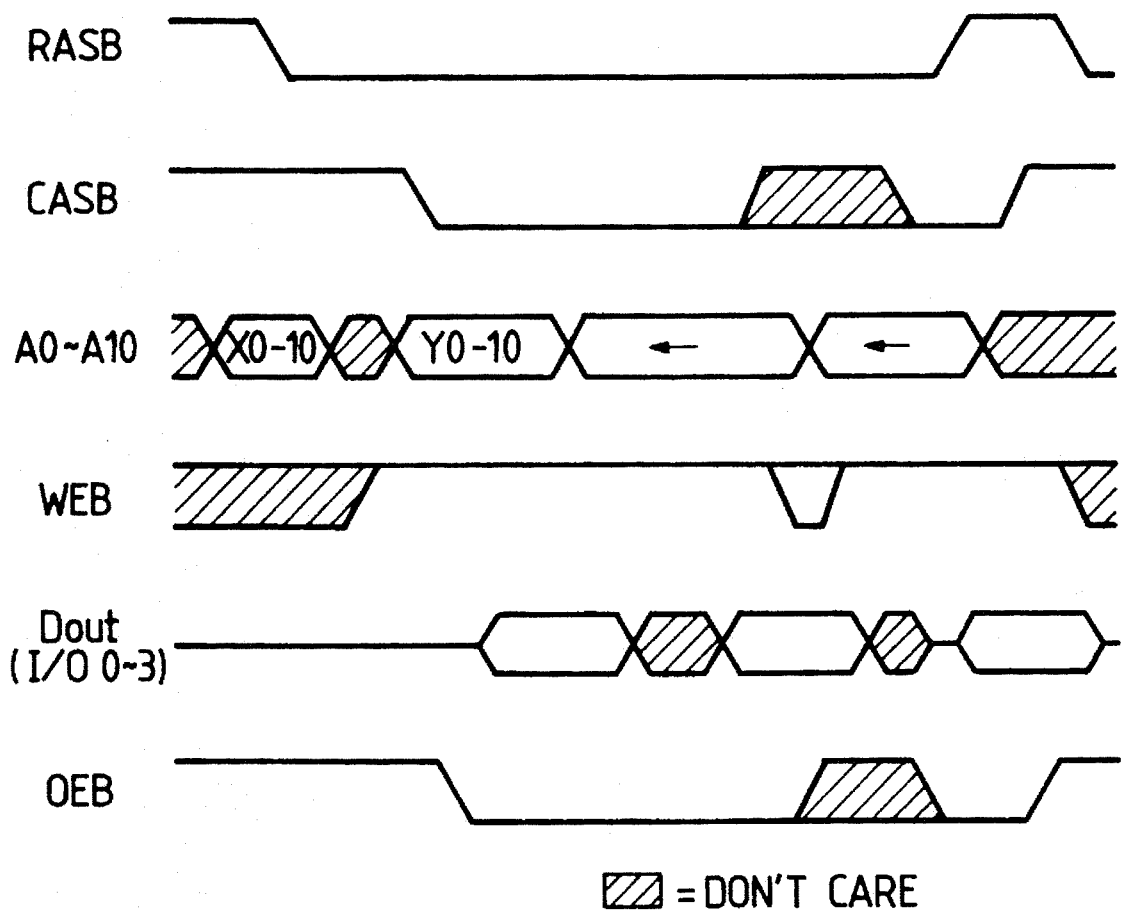

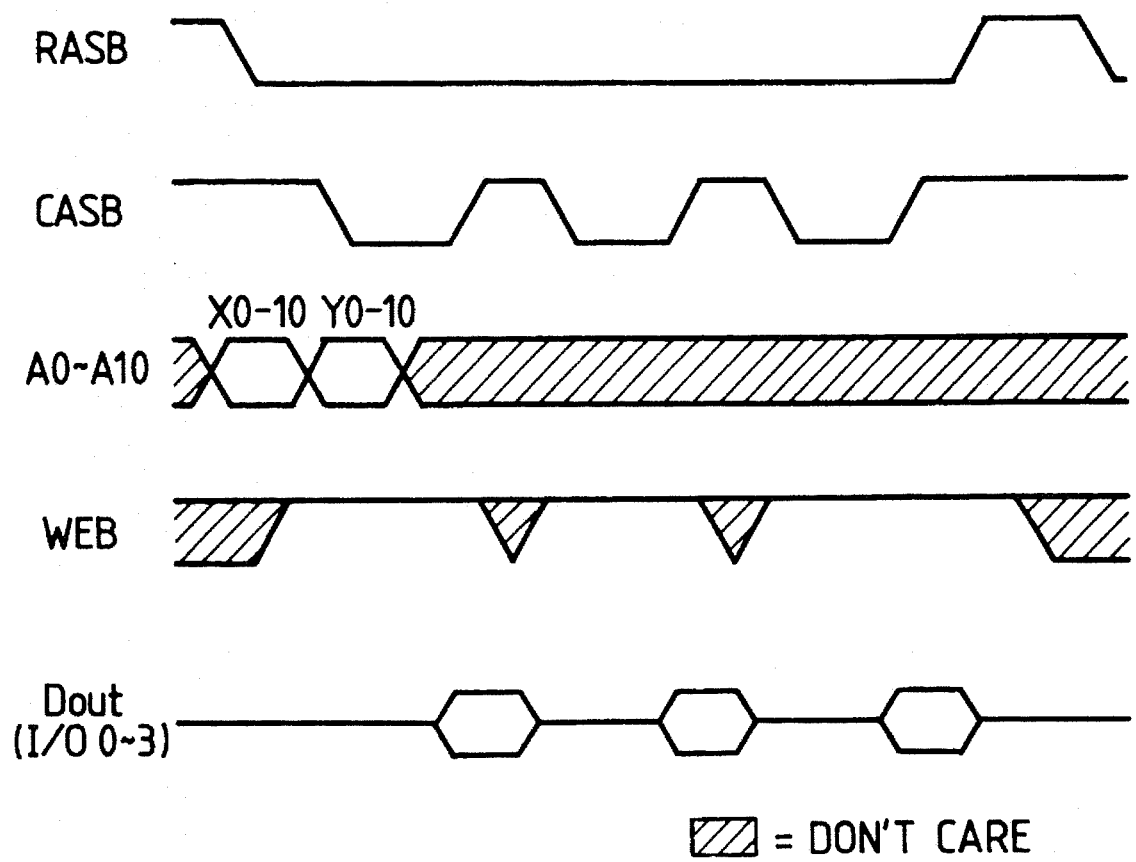

SEMICONDUCTOR MEMORY AND METHOD OF SETTING TYPE

BACKGROUND OF THE INVENTION

The present invention relates generally to semiconductor memories, memory units and a method of setting their types, and more particularly to technology effectively utilizable for RAMs (Random Access Memories) designed to have a greater storage capacity.

U.S. Pat. No. 4,965,768 discloses a memory having a PROM in which its mode can be set after it is packaged.

Dynamic and static RAMs have been manufactured as general-purpose memories in the form of semiconductor integrated circuits, and dynamic RAMs among them have also been manufactured so that different types may be obtained from one base chip to increase their mass-productibity further. The development of different types is achieved by (1) wiring mask option in the wafer process step and (2) bonding option in the assembling step. Then (3) burn-in, common and function tests are made, those which are proved nondefective are subjected to (4) marking, and put in (5) a warehouse to wait for shipment.

In the case of semiconductor memories such as dynamic RAMs, attempts have been made to increase their storage capacity with the progress in semiconductor technology. With increase in their storage capacity and their applications, their memory functions are tending to be diversified.

When about 1M-bit dynamic RAMs and about 4M-bit dynamic RAMs are replaced with about 16M-bit dynamic RAMs to be installed in microcomputers, the demand for refresh cycles, address configuration and power supply voltage by the users of 1M-bit dynamic RAM are different from that by those of 4M-bit dynamic RAM because the peripheral circuits are used without change.

Users to newly use 16M-bit dynamic RAMs, desire RAMs accessible in units of x 1 bit when a large storage capacity is required by the system in which the dynamic RAMs are installed, whereas when the system requires only a small storage capacity, they desire RAMs accessible in units of a plurality of bits such as x 8 bits or x 16 units. Moreover, there are some RAMs requiring high-speed access times and others not requiring such access times depending on the operating speed of the processor used.

SUMMARY OF THE INVENTION

The present inventors have paid special attention to the tendency that dynamic and static RAMs called general-purpose memories have become widely used and products employing such memories have become diversified, and aimed at providing efficiently semiconductor memories having memory functions fit for application modes in final products.

It is therefore an object of the present invention to provide with efficiency a semiconductor memory or a memory unit having functions fit for any mode of application.

It is another object of the present invention to provide a method of developing different types of semiconductor memories with efficiency.

These and other objects and novel features of the present invention will become more apparent as the description proceeds, when considered with the accompanying drawings.

A description will subsequently be given of an representative embodiment of the present invention disclosed in this application. A semiconductor chip equipped with a selection circuit for selecting one of the memory functions and a memory configuration relating to the memory function according to the information stored in built-in nonvolatile memory elements is sealed in a package, so that the memory function or the memory configuration is finally set by writing the nonvolatile memory element in this sealed state or in a state in which the semiconductor chip is mounted on a board. Moreover, the type is set through the aforesaid procedure, and the memory functions include a read or write function.

Since the wafer process up to the assembling step can be made common, it is possible to increase mass-productibity and to facilitate the control. Moreover, semiconductor memories having memory functions and memory configuration satisfying user specifications can be provided in a short time.

BRIEF DESCRIPTION OF THE DRAWINGS

FIGS. 3A and 3B are process charts illustrating a semiconductor memory and principal steps of setting the type of the semiconductor memory according to the present invention.

FIG. 4 is a process chart illustrating a conventional method of setting the type of a dynamic RAM.

FIGS. 5A, 5B and 5C are external views of packages illustrating the arrangement of pins of dynamic RAMs according to the present invention.

FIG. 21 is a timing chart showing a read mode in a high-speed page mode by way of an example.

FIG. 22 is a timing chart showing a read mode in a static column mode by way of an example.

FIG. 23 is a timing chart showing a read mode in a nibble mode by way of an example.

DETAILED DESCRIPTION OF THE INVENTION

Figure 1:
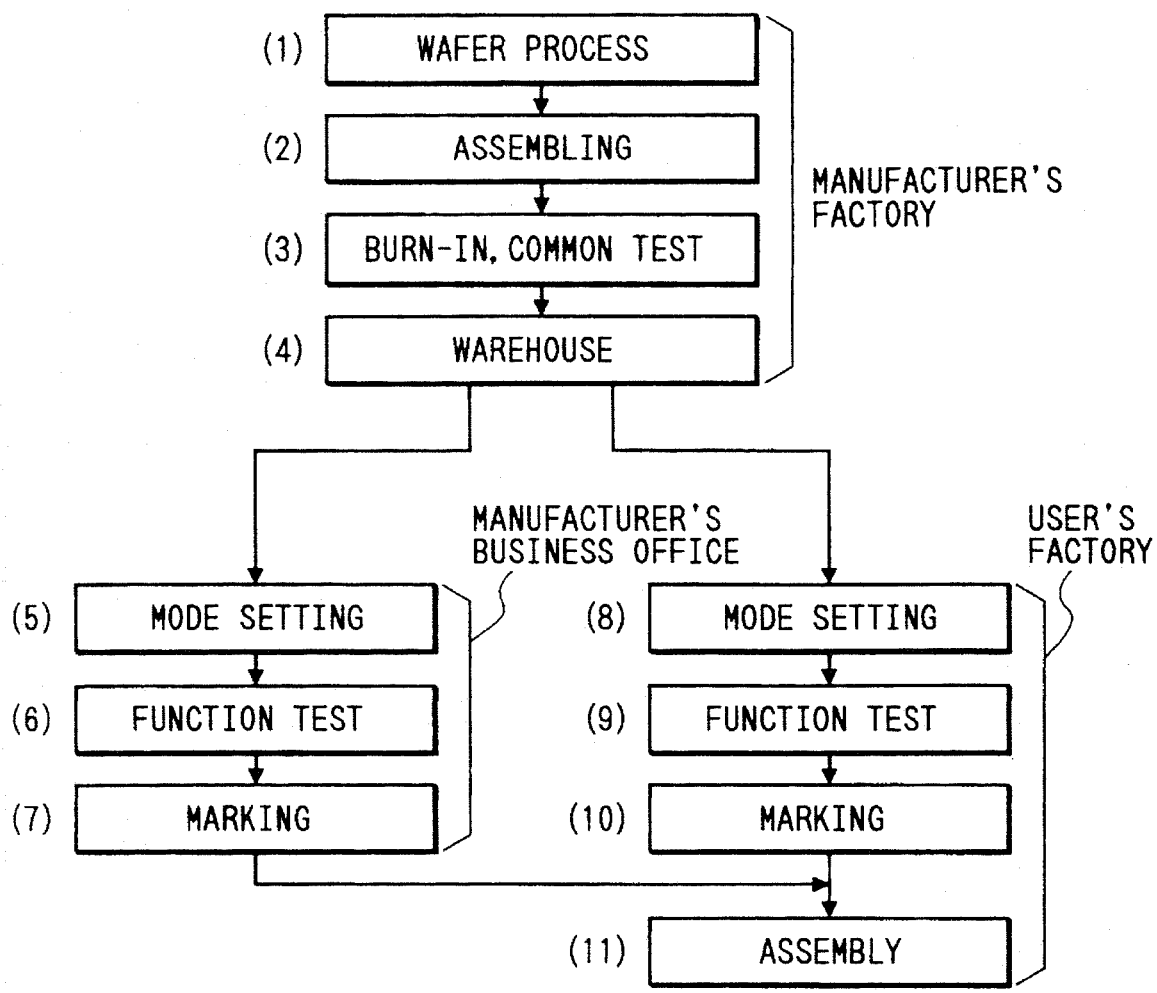
FIG. 1 is a process chart illustrating a semiconductor memory and a method of setting the type of the semiconductor memory according to the present invention.

FIG. 1 is a process chart illustrating a method of setting the type of a semiconductor memory according to the present invention. Unlike a conventional case where memory functions are set in a semiconductor memory at a manufacturer's factory, they are set at a manufacturer's business office or a user's factory as occasion demands, in this embodiment.

During wafer process shown in (1), there are formed semiconductor chips, each of which is provided with a plurality of memory functions including a read or write function and a function selection circuit for selecting any one of the memory functions according to the information stored in nonvolatile memory elements on a semiconductor substrate. During this wafer process, electrical tests are made at the final step of wafer probing. The electrical circuit function tests include DC and function tests. The plurality of memory functions incorporated by means of an equivalent write function for the nonvolatile memory elements utilizing pseudo disconnection pads and the like are also tested simultaneously.

As shown in (2), semiconductor chips which are proved nondefective at the probing step are selected from those incorporated with the semiconductor wafer and packaged in the assembling work including a wire bonding step and so on.

As shown in (3), burn-in (or aging) is carried out to detect initial defects, and a common test using IC handlers, etc., is made. The common test is made to test only the accessible memory functions in the unwritten state of the nonvolatile memory elements.

As shown in (4), semiconductor memories are stored in the warehouses of the manufacturer's factory. The semiconductor memories are managed as those of one type which can be developed into a plurality of types. More specifically, the steps from (1) up to (4) are conducted at the manufacturer's factory, where the semiconductor memories are always managed as those of one type during the wafer process, the assembling and testing. Consequently, no final product marking is made on the packages and in order to facilitate handling and management, easily-erasable marking may be made thereto. Further, the marking may be made on portions common to every mode.

As shown in (5), mode setting is carried out in accordance with user specifications at manufacturer's business office. In other words, the manufacturer's business office gets appropriate semiconductor memories from the manufacturer's factory in correspondence with the orders given from the user and information is written in the nonvolatile memory elements including fuse means to attain memory functions corresponding to the user specifications. Then one of the memory functions is selected by the function selection circuit and semiconductor memories of a type having specific memory functions are set. For example, when the number of bits to be output at a time is set with reference to the memory functions, and when the desired number of bits is one bit (x1 configuration), information corresponding to this configuration is written in the nonvolatile memory elements.

As shown in (6), the function test for confirming whether or not the function set above is properly performed, and when the performance of the function is confirmed, the semiconductor memory is provided with a mark in step (7) to make it possible to identify the semiconductor device of a specified type.

Since the steps (5) through (7) are conducted at the manufacturer's business office, the time from the order by the user to the delivery to the user can be minimized. When the number of units ordered is small, it is possible to ship them on the next day of the date of ordering. This means that, unlike the conventional method of developing types which is based on wiring mask option and bonding option as shown in FIG. 4, it takes several months at the earliest until the shipment after the order is given, and consequently the time can be greatly reduced.

Figures 7, 8:
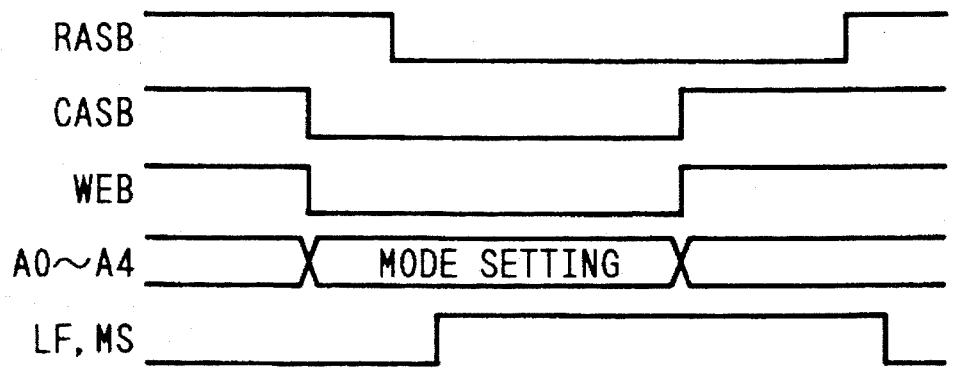
FIG. 7 is a timing chart illustrating an example of the operation of setting a mode.
FIG. 8 is a table showing combinations representing the relation between the modes and the address signals in the mode setting operation according to the present invention.

Such mode setting may be carried out at the user's factory if the user desires; in other words, semiconductor memories of a type which can be developed into a plurality of type completed at the manufacturer's factory are. and then information is written in the nonvolatile memory elements to carry out the mode setting required as stated above as shwn in FIG. 8. Then the function test (9) is made and making (10) is provided in the same manner as in the manufacturer's business office and those semiconductor memories are packaged in (11).

This arrangement is convenient because the memory configuration does not become known publicly beforehand when the user attempt to develop products in strict confidence, and the manufacturer can flexibly deal with the alteration of the product function and the number of products. For example, when the number of products with some functions must be decreased, and the number of products with other functions must be increased, this alteration can be managed by the alteration of mode setting.

Figure 2:
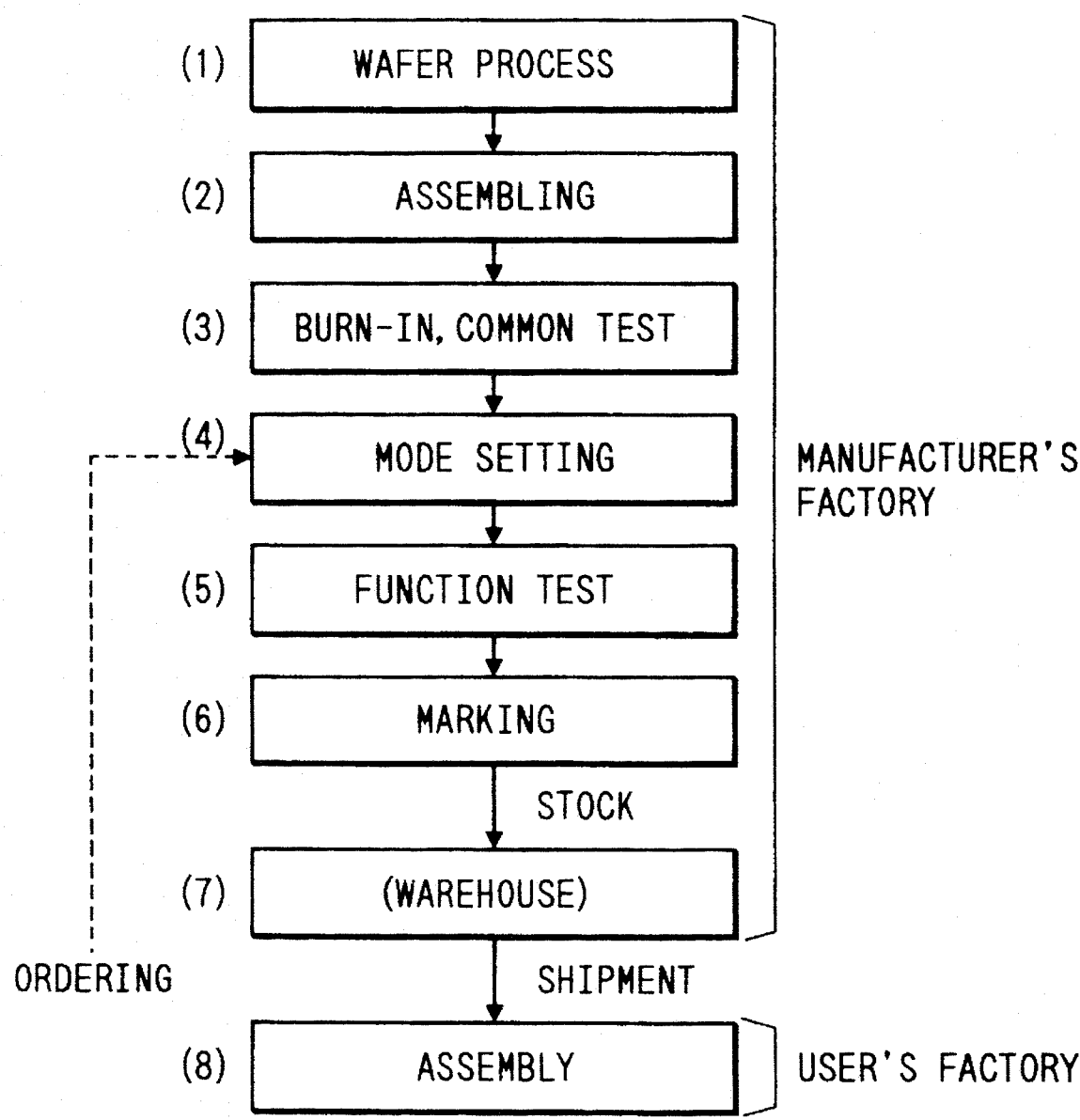
FIG. 2 is a process chart illustrating another semiconductor memory and another method of setting the type of the semiconductor memory according to the present invention.

FIG. 2 is a process chart illustrating another method of setting the types of semiconductor memories according to the present invention. With reference to this embodiment, the processes from the mode setting up to the shipment are performed in the manufacturer's factory. From the wafer process (1) up to the burn-in and common test (3), are conducted similarly to those shown in FIG. 1. Upon acceptance of an order from the user, mode setting and marking corresponding to the user's specifications are are then carried Out as shown in (4) to (6), and the semiconductor memories are stored in a warehouse (7) once and then shipped.

In order to make shorter the delay in time from the user's order up to the shipment, the processes from the wafer process step in (1) up to the burn-in and common test (3) are performed prospectively. The semiconductor memories thus processed may be stored in a warehouse temporalily. The processes to the mode setting (4) are carried out after acceptance of the order. In this case, it is possible to use an equipment capable of continuously executing two or three steps out of these three steps so as to shorten the term of the work.

FIGS. 3A and 3B are process charts illustrating the principal steps of setting the type of a semiconductor memory according to the present invention. More specifically, the mode setting is carried out after marking is made in accordance with the user specifications and the function test is made as shown in FIG. 3A. The marking is made at the manufacturer's factory as shown in FIG. 1 and the mode setting and the later steps are carried out at the manufacturer's business office. In FIG. 3B, the marking is carried out after the mode setting and then the function test is made. The marking cab be made before or after the mode setting or the function test.

FIGS. 5A to 5C are external views of packages, illustrating the arrangement of the pins of dynamic RAMs embodying the present invention. Packages of 34 pins are employed in this embodiment. There are three types of dynamic RAM having an approximately 64M-bit storage capacity accessible in units of bits (x8) as shown in FIG. 5A; in units of 4 bits (x4) as shown in FIG. 5B; and in units of 1 bit (x1) as shown in FIG. 5C. In these drawings, NC denotes a free terminal which is not connected to the internal circuit.

In FIGS. 5A to 5C, the symbol "/W" put beside terminal No. 8 denotes a write enable signal terminal WEB, "/RE" of No. 9 terminal a row address strobe signal terminal RASB, "/G" of terminal No. 27 an output enable signal terminal OEB, and "/CE" of terminal No. 28 a column address strobe signal terminal CASB. In FIG. 5C, "D" of terminal No. 2 denotes a data input terminal and "Q" of terminal No. 23 a data output terminal. In FIGS. 5A and 5B, data terminals DQ0 to DQ7 represent data input/output terminals. The reason for the addition of B to the end of the name of each signal is that the signals of the names with "B" are bar signals changing the level from a low-level to an active level.

Figure 6:
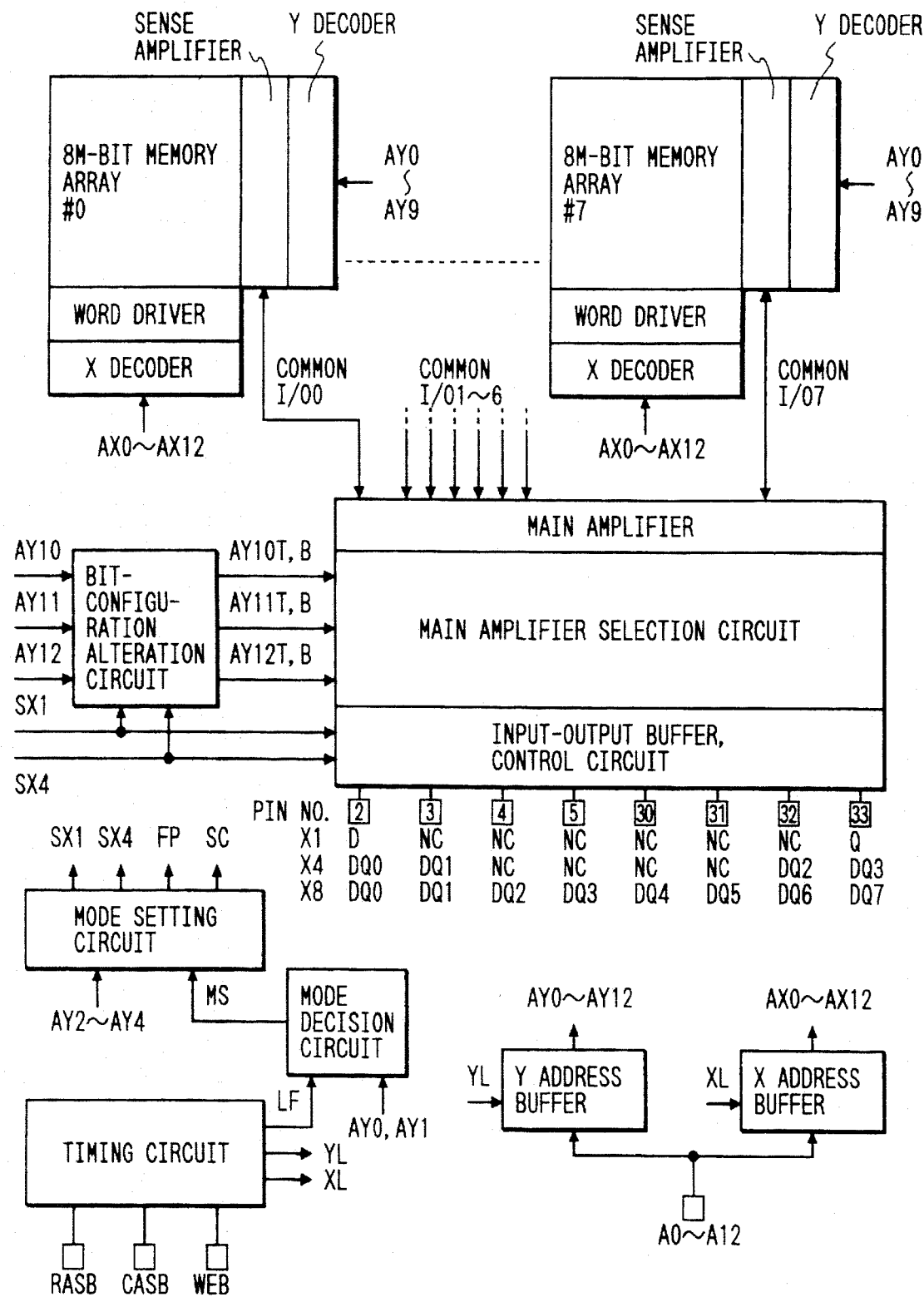
FIG. 6 is a block diagram showing a dynamic RAM whose type can be set like in FIG. 5, according to the present invention.

FIG. 6 is a block diagram showing of a dynamic RAM whose tyep can be specified embodying the present invention. Each block of FIG. 6 is formed on one monocrystalline silicon semiconductor substrate through known semiconductor circuit technology.

There are provided eight memory arrays #0 up to #7 having an approximately 8M-bit storage capacity. One memory array comprises about 8,000 (8,192) word lines and about 1,000 (1,024) bit lines (sometimes called data or digit lines). Then, 13-bit address signals comprising AX0 to AX12 to be transmitted via an X address buffer are supplied to an X decoder for selecting the word lines, respectively. The X decoder decodes the above 13-bit address signal and performs 1/8192 selection. The word driver receives the selecting signal decoded by the X decoder and makes one word line in a selected state according to the selecting signal.

On receiving lower 10-bit address signals AY0 to AY9 out of 13-bit address signals including AY0 to AY12 and transmitted via a Y address buffer, each Y decoder for selecting bit lines decodes the signals and performs 1/1024 selection.

The address signals AX0 to AX12 and AY0 to AY9 are commonly supplied to the eight memory arrays #0 to #7 as stated above and one memory cell is selected in each of them. Common I/O0 to I/O7 to which memory cells selected in the memory arrays #0 to #7 are respectively connected are connected to the inputs connected to a main amplifier. The output signals of the main amplifier are applied via a main amplifier selection circuit to the input terminals of an output buffer. The eight output terminals of the output buffer are connected to pins Nos. 2, 3, 4, 5, 30, 31, 32 and 33.

On the other hand, the pins Nos. 2, 3, 4, 5, 30, 31, 32 and 33 are also supplied to the input terminals of an input buffer and their output signals are connected to the common I/O0 to I/O7 via input selection circuits provided in the main amplifier selection circuit.

On receiving a row address strobe signal RASB, a column address strobe signal CASB and a write enable signal WEB, a timing circuit forms timing signals XL, YL, LF and so on necessary for the operation of the internal circuit. The timing signal XL is what is generated in synchronization with the low level of the row address strobe signal RASB and used to activate the X address buffer and to take in the address signals supplied from the address terminals A0 to A12 as X address signals. The timing signal YL is what is generated in synchronization with the low level of the column address strobe signal CASB and used to activate the Y address buffer and to take in the address signals supplied from the address terminals A0 to A12 as Y address signals.

LF is a timing signal generated at WCBR timing; in other words, it is a timing signal generated when the signals CASB and WEB are at the low level when the signal RASB is made to go to the low level. The timing signal LF is supplied to a mode decision circuit. Lower 2-bit Y address signals AY0 and AY1 for designating a mode are supplied to the mode decision circuit. When a mode setting mode is decided to be established in the mode decision circuit, a mode setting signal MS is generated.

A mode setting circuit is activated by the mode setting signal MS and address signals AY2 to AY4 for designating the mode are taken in. Then four kinds of mode setting signals SX1, SX4, FP and SC are generated by the address signals AY2 to AY4. SX1 designates access in units of 1 bit and SX4 access in units of 4 bits. FP designates a high-speed page mode as will be described later and SC a static column mode. Thus eight kinds of modes can be set.

SX1 and SX4 generated in the mode setting circuit are supplied to a bit configuration alteration circuit and further to an input-output buffer. On receiving upper 3-bit Y address signals Y10 to AY12, the bit configuration alteration circuit generates AY10T, AY10B to AY12T, AY10B to be supplied to the main amplifier selection circuit according to the mode setting signals SX1 and SX4. In this case, AY10T is a true signal corresponding to the address signal AY10, and AY10B is an inverted signal (bar signal) of the address signal AY10.

When the signal SX1 is designated, 3 bits of the address signals AY10 to AY12 are made effective and the main amplifier circuit is caused to operate in correspondence with one of the eight memory arrays #0 to #7. When the signal SX4 is designated, the bit AY10 among the address signals AY10 to AY12 is made effective and the main amplifier circuit is caused to operate in correspondence with one of the four even-numbers memory arrays #0 to #6 or the four odd-numbered memory arrays #1 to #7 among the eight memory arrays #0 to #7. When the signals SX1 and SX4 are not designated, all of the address signals AY10 to AY12 are made ineffective and all of the eight memory arrays #0 to #7 are placed in an selective state.

FIG. 8 is a table of combinations showing the relation between modes and address signals according to the present invention, wherein two modes, FP mode (high-speed page mode) and SC mode (static column mode), can be set with respect to each of the x1, x4 and x8 bits.

In order that a test mode is effected at the above WCBR timing, which is not restrictive, the mode setting mode is selected using the address signals AY0 and AY1 to distinguish therebetween. In other words, the mode setting mode is established while the address signals AY0 and AY1 both are at a high level (1), and the signal MS is generated in the mode setting mode. With the combination of the signal MS and 3 bits of the address signals AY2 to AY4, the above six kinds of modes can be set by the mode setting circuit. The address signal AY2 designates the high-speed page mode at 0 and the static column mode at 1. The address signals AY3 and AY4 designate x1, x4 and x8.

Since four kinds of modes can be designated using the address signals AY3 and AY4, it is also allowable to establish a mode for memory access in units of 16 bits. In this case, 16 memory arrays #0 to #15 can be arranged. The memory arrays may be divided into two groups in the direction of X, each having about 4-bit configuration of 4,096×1,024. The uppermost bit AX12 of X system is supplied to the bit configuration alteration circuit in accordance with such a bit configuration.

Figure 9:
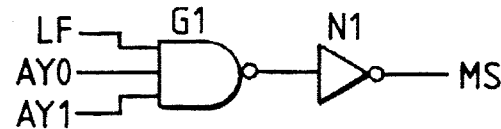
FIG. 9 shows a mode decision circuit according to the present invention.

FIG. 9 is a diagram showing mode decision circuit according to the present invention. The mode decision circuit comprises a 3-input NAND gate circuit G1 and an output inverter circuit N1. The signal LF, and the address signals AY0 and AY1 generated at the above WCBR timing are supplied to the gate circuit G1. When all of these signals are logically 1, the mode setting mode signal MS is set at logical 1. In place of the NAND gate circuit G1, a NOR gate circuit may be used. In this case, the mode setting mode signal MS of logical 1 is produced unlike the above case when the signal LF, the address signals AY0 and AY1 are all made 0.

Figure 10:
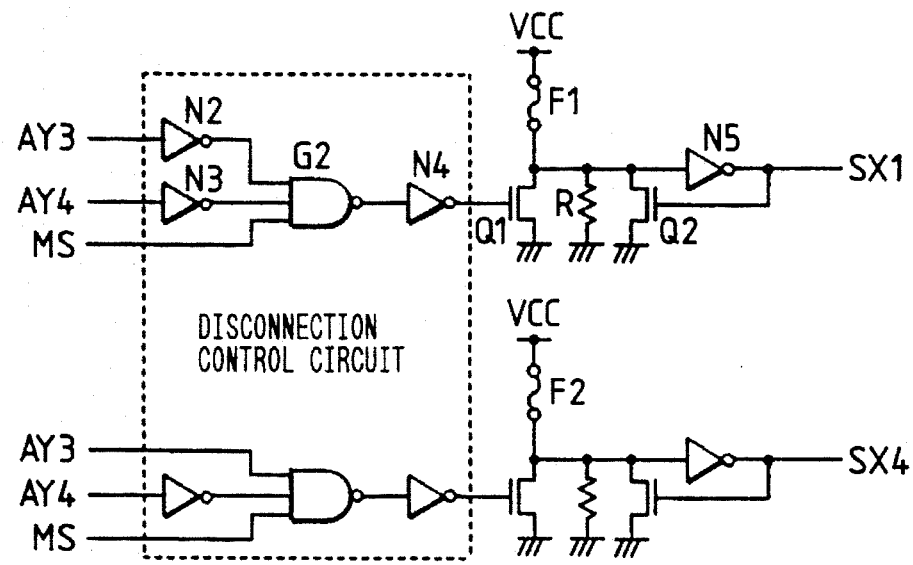
FIG. 10 shows a mode setting circuit according to the present invention.

FIG. 10 is a diagram illustrating a mode setting circuit embodying the present invention, wherein fuse means F1, F2 are provided as the nonvolatile memory elements for setting modes. These fuse means F1, F2 are formed of polysilicon layers, and windows are provided in the surface protective films to expose the fuses so as to ensure the fusing.

In the mode setting circuit for producing the signal SX1 meeting the conditions of FIG. 8, the signal MS and the output signals of inverter circuits N2, N3 which receive the address signals AY3 and AY4 are supplied to a NAND gate circuit G2. The output signal of the NAND gate circuit G2 is inverted by an inverter circuit N4 before supplied to the gate of a MOSFET Q1 for causing a fusing current to flow.

The source of the MOSFET Q1 is connected to the Ground potential, and the drain thereof is connected to one end of the fuse means F1. The power supply voltage is supplied to the other end of the fuse means F1. The MOSFET Q1 is provided with a pull-down resistor R having a greater resistance. A MOSFET Q2 installed between the input of an inverter circuit N5 and its ground potential, together with the inverter circuit N5, forms a latch circuit when the output signal SX1 of the inverter circuit N5 is supplied to the MOSFET Q2.

While the signal MS is at the high level (1) and the address signals AY3 and AY4 both are at the low level (0), the output signal of the NAND gate circuit G2 is set at the low level and the output signal of the inverter circuit N4 at the high level. Thus the MOSFET Q1 is turned on so as to a relatively large current for fusing the fuse means F1 to be flow. If either of the address signals AY3 and AY4 is at the high level, the fuse means F1 will not be fused.

When the fuse means F1 in the mode setting circuit is cut, the pull-down resistor R causes the input signal of the inverter circuit N5 to go to the low level, whereby the inverter circuit N4 generates the signal SX1 of high level. By the signal SX1 of high level, the MOSFET Q2 is turned on to fix the input of the inverter circuit N5 at the low level due to a low impedance and to latch its output.

When the fuse means F1 in the mode setting circuit is not fused, the input signal of the inverter circuit N5 is at the high level because the resistance of the fuse means F1 is smaller than that of the pull-down resistor R. Consequently, the inverter circuit N4 generates the signal SX1 of low level (0). By the signal SX0 of low level, the MOSFET Q2 is turned off.

In the mode setting circuit for producing the signal SX4 meeting the conditions of FIG. 8, the signal MS, the address signals AY3 and the output of the inverter circuit which receives the signal AY4 are supplied to a NAND gate circuit. The output signal of the NAND gate circuit is inverted by an inverter circuit before supplied to the gate of MOSFET Q for causing a fusing current to flow. Since the signal SX4 is thus generated only when the address signal AY3 remains at the high level and the address signal AY4 at the low level, the inverter circuit is correspondingly provided. The description of the other configurations and the reading operation will be omitted because they are the same as in the case of the signal SX1.

The mode setting circuit is also provided with a circuit for producing the signals FP and SC. Although not shown in FIG. 6, the following arrangement is made. The signal MS and the address signal AY2 are supplied to the NAND gate circuit and its output is inverted by an inverter circuit and supplied to a MOSFET for fusing. Then a latch circuit comprising fuse means, a pull-down resistor, an inverter circuit and a feedback MOSFET is provided in correspondence with the above MOSFET so as to generate the signal SC. Further, the signal SC is inverted by the inverter circuit to obtain the signal FP.

Figure 11:
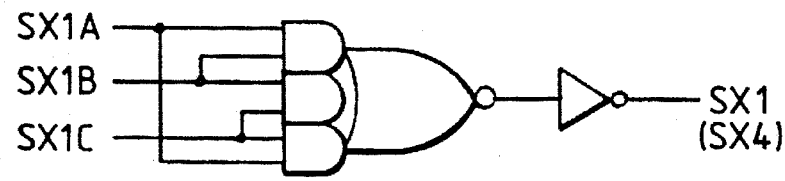
FIG. 11 shows another output part of the mode setting circuit according to the present invention.

FIG. 11 is a diagram showing another example of the output part of the mode setting circuit according to the present invention. This example is intended to enchance the reliability of the mode setting operation performed according to whether or not the fuse means are cut. More specifically, the signal level tends to vary because of the ratio of the resistance to that of the pull-down resistor in a state the fuse is not completely cut though cutting of the fuse means is tried as stated above, thus causing malfunction to occur. Therefore a mode setting circuit having three fuses uses for one signal SX1 is provided, and its output signals SX1A to SX1C are supplied to a majority logic circuit to generate the signal SX1 for actually setting a mode. The signal SX4 is also generated by a similar majority logic circuit. In this arrangement, even though one of the three fuse circuits is cut by mistake, proper mode setting is effected by the other two fuses, so that the reliability is increased.

Figure 12:
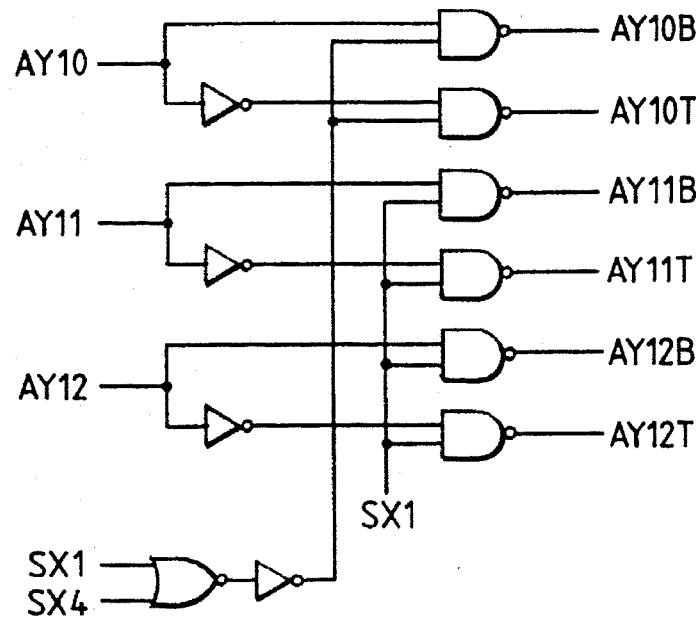
FIG. 12 shows a bit configuration alteration circuit according to the present invention.

FIG. 12 is a diagram showing a bit configuration alteration circuit according to the present invention. In this embodiment, through signals and bar signals inverted by the inverter circuit are produced with respect to the address signals AY10 to AY12 and they are selectively output via NAND circuits. The NAND circuit corresponding to the through and bar signals of the address signal AY10 is controlled by a control signal generated by the NOR gate circuit for receiving the signals SX1 and SX4 and by the inverter circuit connected to the output of the NOR gate circuit. In other words, the gate of the NAND gate circuit for transmitting the address signal AY10, that is, for making the address signal AY10 effective is opened when either signal SX1 or SX4 is 1.

The NAND gate circuits corresponding to the through and bar signals of the address signals AY11 and AY12 are controlled by the signal SX1. In other words, the gates of the NAND gate circuits for transmitting the address signals AY10 and AY12, that is, for making these signals effective are opened when the signal SX1 is 1.

While the signals SX1 and SX4 are at the low level, the gates of all the NAND gate circuits are closed and all the output signals AY10T, AY10B to AY12T, AY12B are set at the high level. The main amplifier selection circuit thereby opens all the gates and places the selection circuits corresponding to the eight memory arrays #0 to #7 in a selective state, so that memory access in units of x8 bits is effected. When the signal SX4 is set at the high level, the gate circuit corresponding to the address signal AY10 opens to make selection signals AY10T and AY10B effective. Consequently, memory access is effected in units of 4 bits corresponding to the even-numbered memory arrays #0 to #6 or the odd number memory arrays #1 to #7. When the signal SX1 is set at the high level, the selection signals AY10T, AY10B to AY12T, AY12B corresponding to all the address signals AY10 to AY12 are made effective, so that memory access in units of 1 bit corresponding to one memory array selected from the above combinations is effected.

Figure 13:
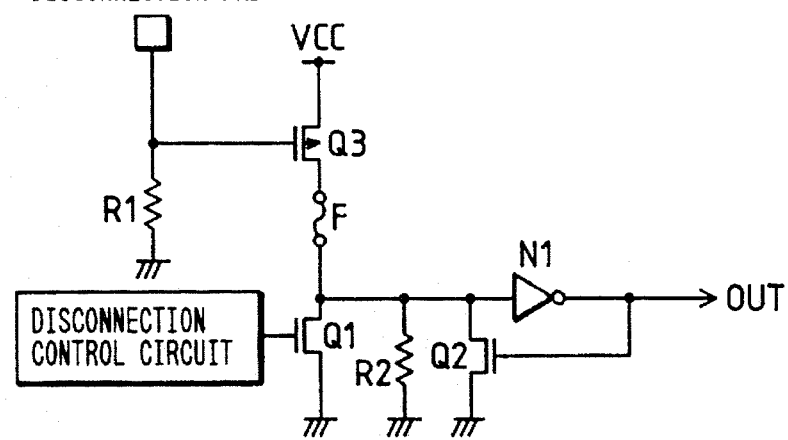
FIG. 13 shows a still another mode setting circuit according to the present invention.

FIG. 13 is a diagram showing a still another mode setting circuit according to the present invention with the addition of a test function for creating a state equivalent to the cut of a fuse means F without actually cutting the fuse means F. In other words, the test function makes it possible to test the mode set without cutting the fuse, that is, without writing of the fuses as nonvolatile memory elements.

Power supply voltage VCC is supplied via a P-channel MOSFET Q3 to the fuse means F. The gate of MOSFET Q3 is connected via a pull-down resistor R1 to the ground potential of the circuit. A pseudo disconnection pad is provided at the gate of MOSFET Q3. Since a disconnection MOSFET Q1, a feedback MOSFET Q2, a pull-down resistor R2 and an inverter circuit N1 for the above fuse means F are similar to those in the circuit of FIG. 10, the description of them will be omitted. In this case, however, the symbols of some elements are different from those in FIG. 10.

Probes are brought into contact with the pseudo-cut pads during probing performed when the dynamic RAMs are completed on a semiconductor wafer. When there is created a state in which the fuse means F is cut, a high-level voltage like, the power supply voltage VCC is supplied via the probe to the pseudo-cut pad. As a result, the P-channel MOSFET-Q3 is turned off to place the fuse means F in an equivalent fused state. It is thus possible to test whether or not memory access in units of x1 bit or x4 bits can be made in accordance with the spurious cutting of the fuse means F. The static column mode can be also designated.

Figure 14A:
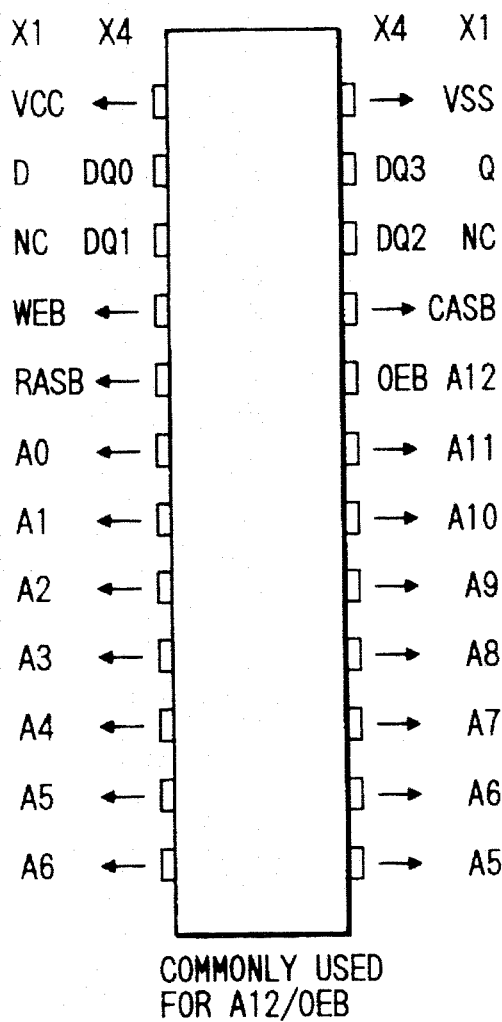
FIGS. 14A and 14B are external views of other packages, for illustrating the arrangements of pins of dynamic RAMs according to the present invention.
Figure 14B:
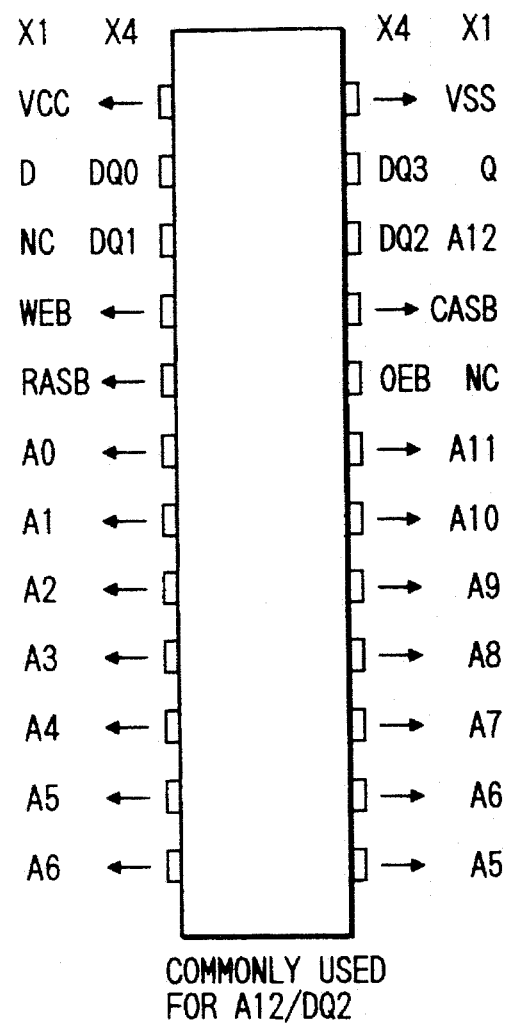

FIGS. 14A and 14B are external views of other packages illustrating the arrangements of pins of dynamic RAMs according to the present invention. In this embodiment, using 24-pin packages, dynamic RAMs having an approximately 64M-bit storage capacity are developed to the one accessible in unit of x1 bit and the one accessible in unit of x4 bit. As shown in FIGS. 14A, 14B, NCs represent free terminals which are not connected to the internal circuit, and the arrows of the x4 bit configuration are the same of the x1 bit configuration.

As shown in FIG. 14A, the output enable terminal OEB necessary for the x4 bit configuration is used for the address signal A12 of the x1 bit configuration. In the case of FIG. 14B, a data terminal DQ2 necessary for the x4 bit configuration is used for the address signal A12 of the x1 bit configuration. However, the address signal A12 and the data terminal DQ1 can commonly (selectively) be used.

Figure 15:
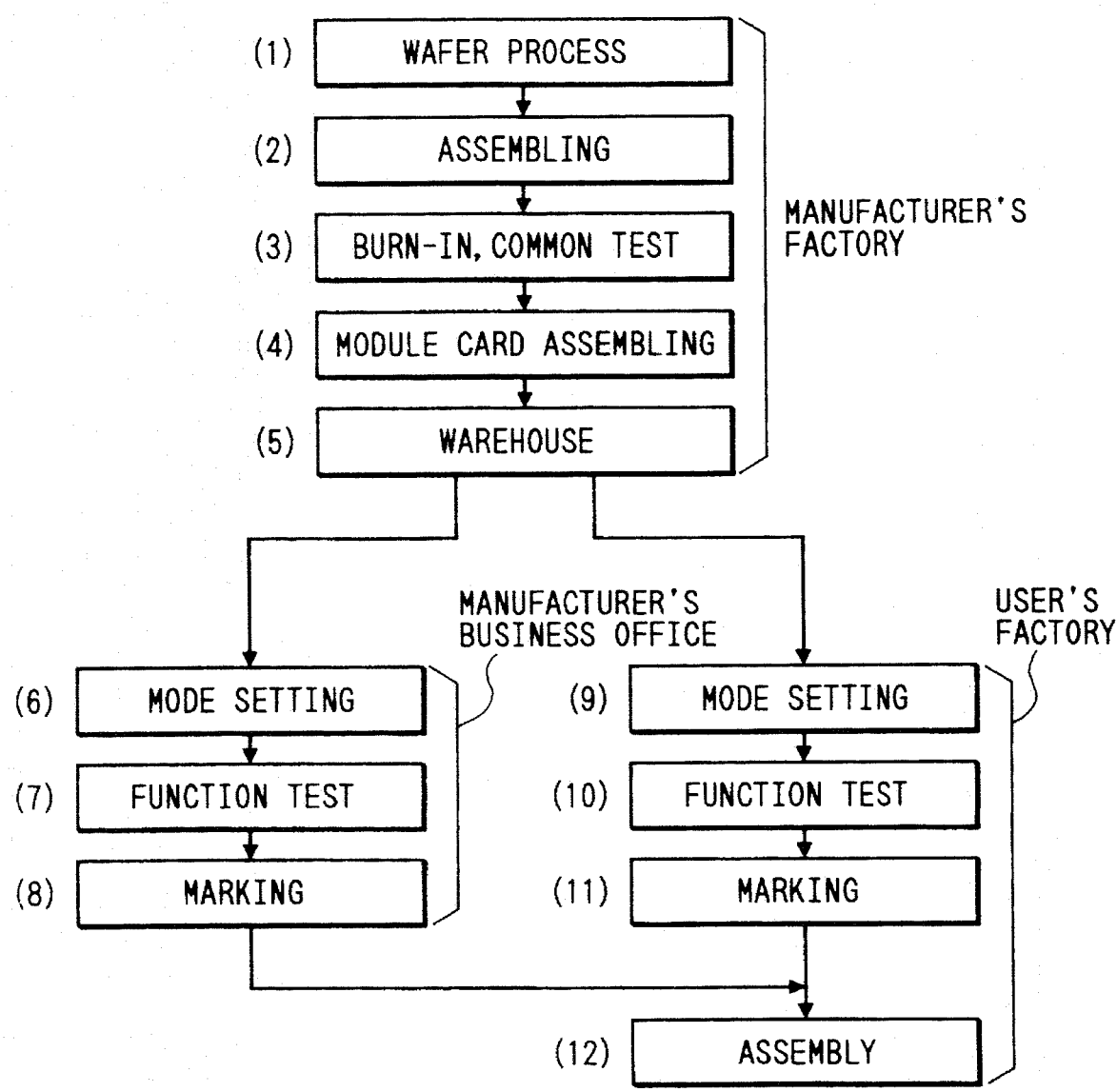
FIG. 15 is a schematic block diagram illustrating a memory module and its mode setting device according to the present invention.

FIG. 15 shows a memory module a process chart illustrating a method of setting the type of the memory module according to the present invention. This embodiment is applied to a memory module in which a plurality of semiconductor integrated circuits are mounted on a mounting board in such a state that modes can be set therein as noted previously.

As shown in (1), during wafer process, there are formed semiconductor chips, each of which is provided with a plurality of memory functions including a read or write function and a function selection circuit for selecting any one of the memory functions according to the information stored in nonvolatile memory elements on a semiconductor substrate. During this wafer process, electrical tests are made at the final step of wafer probing. The electrical circuit function tests include DC and function tests. The plurality of memory functions incorporated by means of an equivalent write function for the nonvolatile memory elements utilizing pseudo disconnection pads and the like are also tested simultaneously.

As shown in (2), semiconductor chips which are proved nondefective at the probing step are selected from those incorporated in the semiconductor wafer and packaged in the assembling work including a wire bonding step and so on.

As shown in (3), burn-in (or aging) is carried out to detect initial defects, and a common test using IC handlers, etc., is made. The common test is made to test only the accessible memory functions in the unwritten state of the nonvolatile memory elements. The procedure is the same as in the case of FIG. 1 up to this stage. Then (in (4)) a plurality of such semiconductor integrated circuits are mounted on a board and formed into one memory module. In this case, the mounting board may be in the form of a card.

Further, an address bus, a data bus and a control bus formed by printed wiring are connected to the memory module. The printed wiring is led to connector electrodes and connected by plugging the connector into a memory board slot of the memory in the memory storage in a computer system. The information storage capacity of the memory of the computer system is thus determined by the number of DRAMs mounted on the memory board, that is, the memory module according to the present invention.

As shown in (5), the memory modules (memory units) thus fabricated are stored in warehouse of the manufacturer's factory. The modules are managed as those of one type which can be developed into a plurality of types. More specifically, the steps from (1) up to (5) are conducted at the manufacturer's factory, where the modules are always dealt with as those of one type throughout the wafer process, the assembly and the testing. Consequently, no final product marking is given to the packages and in order to facilitate their handling and management, easily-erasable marking can be given thereto. Further, marking can be applied to portions common to every mode.

Figure 16:
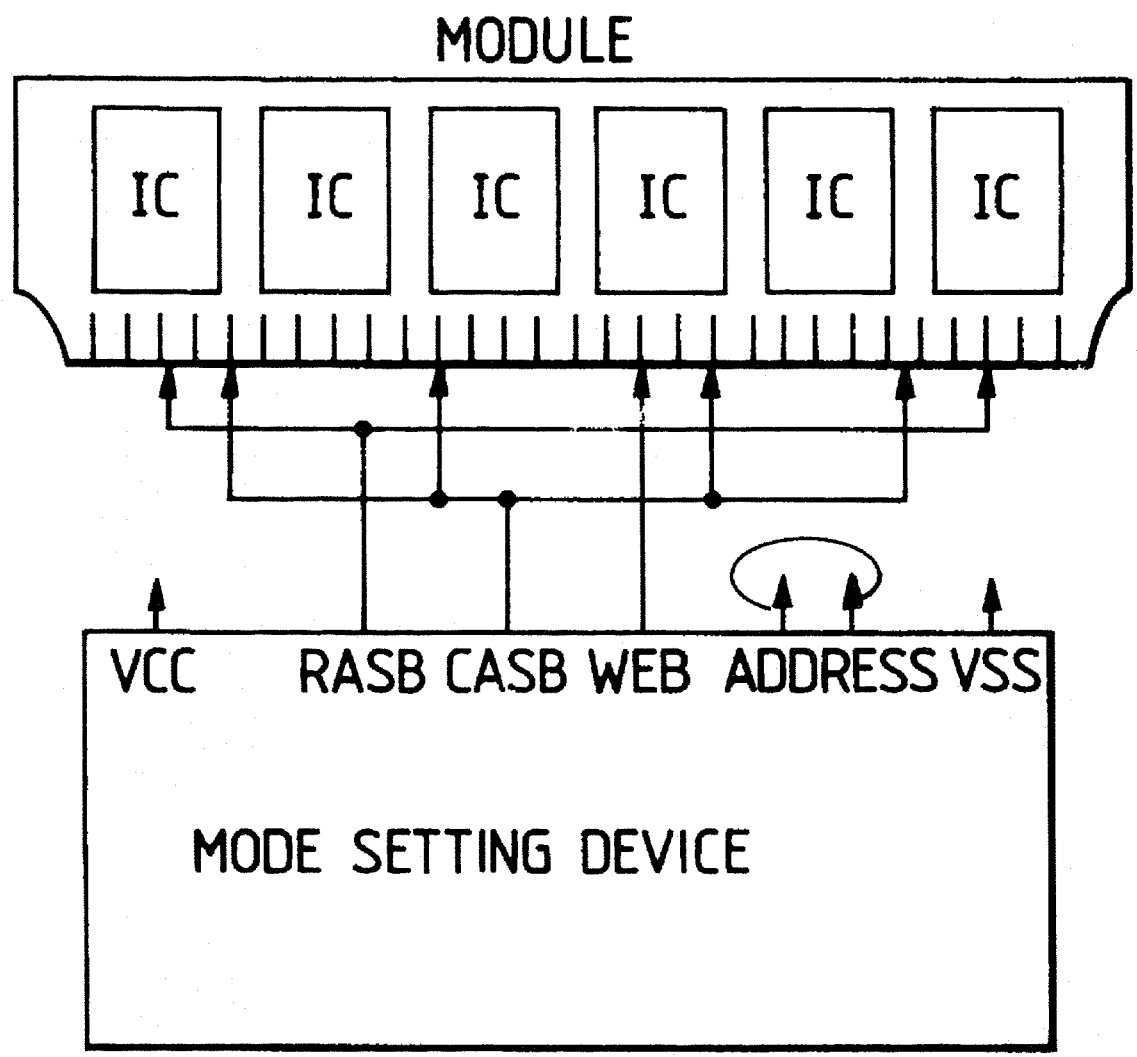
FIG. 16 is a process chart illustrating a memory module using a semiconductor memory according to the invention and a method of setting the type of the memory module.

As shown in (6), mode setting is carried out in accordance with user specifications at a manufacturer's business office. In other words, the manufacturer's business office gets appropriate modules from the factory in correspondence with the order of the user and the nonvolatile memory elements including fuse means are written to attain the memory functions corresponding to the user specifications by means of a mode setting device for setting modes on a module unit basis as shown in FIG. 16. Then one of the memory functions is selected by the function selection circuit, and semiconductor memories of one type having specific memory functions are produced.

As shown in (7), the function test for confirming whether or not the function set above is properly performed, and when the performance of the function is confirmed, the module is provided with a mark in (8) to produce semiconductor memories of a specific type identifiable even from the appearance. In this case, the marking can be made on the IC unit or the module boards, or on the card if the module is in the form of a card.

Since the steps (6) through (8) are conducted at the manufacturer's business office, the time from the order by the user to the delivery to the user can be minimized. When the number of modules ordered is small, it is possible to ship them on the next day of the date of ordering. This means that unlike, the conventional method of developing types which is based on wiring mask option and bonding option as shown in FIG. 4. It takes several months at the earliest to fabricate memory devices and to assemble semiconductor memory modules, and consequently the time becomes greatly reducible.

Such mode setting may be carried out at the user's factory if the user desires; in other words, semiconductor memories of one type which can be developed into a plurality of type completed at the manufacturer's factory are obtained and then the nonvolatile memory elements are written to carry out the mode setting required as stated above as shown in (9). Then the function test is made (10) and the marking is provided (11) in the same manner as in the manufacturer's business office and those semiconductor modules are packaged in (12).

This arrangement is convenient because the memory configuration does not becme know publicly beforehand when the user attempt to develop products in strict confidence, and the manufacturer can flexibly deal with the alteration of the product function and the number of products. For example, when the number of products with some functions must be decreased, and the number of products with other functions must be increased, this alteration can be managed by the alteration of mode setting.

Figure 17:
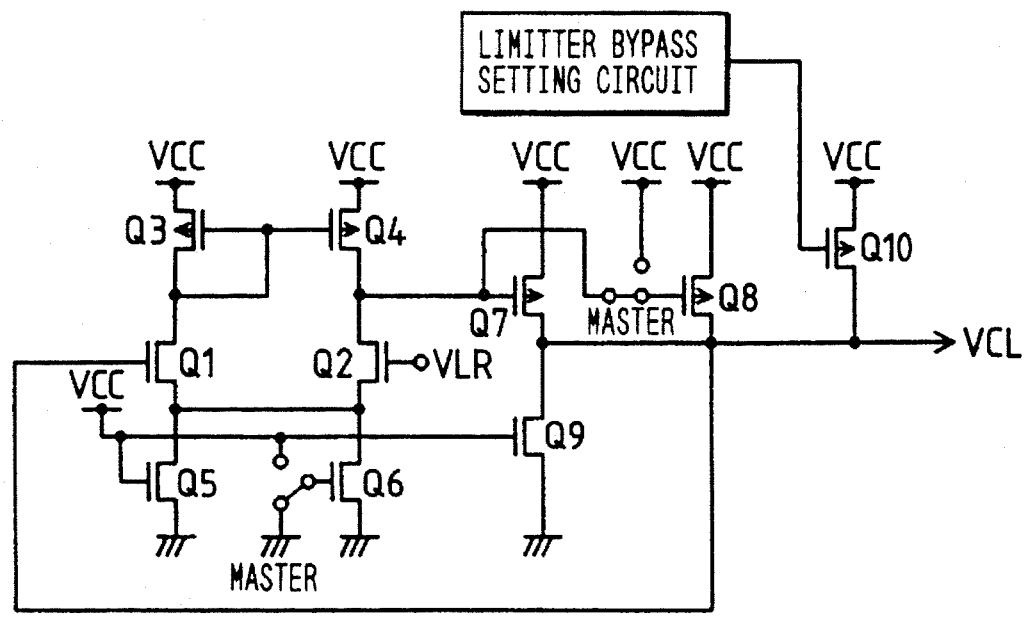
FIG. 17 shows an operating voltage switching circuit in a dynamic RAM according to the present invention.

FIG. 17 is a diagram showing an operating voltage switching circuit provided in a dynamic RAM according to the present invention. Although some reference symbols in FIG. 17 are also used in the other circuit diagrams only to simplify this circuit, it should be understood that those elements have different functions, respectively. This can be applied to all the other circuits in this application.

A differential amplifier circuit comprises N-channel differential amplifiers MOSFET Q1 and Q2, P-channel current mirror type loads MOSFET Q3, Q4 respectively provided between the drains and power supply voltages VCC, and a constant current MOSFET Q5 provided between the common sources of the differential MOSFET Q1, Q2 and the ground potential. The output signal of the differential amplifier circuit is output via an output circuit comprising a P-channel output MOSFET and an N-channel constant current MOSFET Q9. The N-channel MOSFET Q6, though not restricted, selectively receives the power supply voltage VCC at its gate via a master slice and operates as to increase the operating current of the differential circuit. Similarly, the output driving capability of the P-channel MOSFET Q8 is made switchable when its gate is supplied by the master slice with the output signal of the differential amplifier circuit or the power supply voltage VCC.

The differential amplifier circuit and the output circuit constitute an operational amplifier circuit, whose output is fed back to the gate of the differential MOSFET Q1 having an inverted input, whereby a voltage follower circuit is formed. A constant voltage VLR is supplied to the gate of the differential MOSFET Q2 having a non-inverted input. Consequently, this circuit forms an internal operating voltage VCL corresponding to the constant voltage VLR.

In this embodiment, a P-channel power switch MOSFET Q10 is provided between the output terminal VCL and the power supply terminal VCC so as to providing the operating mode for making the internal circuit operable by the power supply voltage VCC. A control signal generated by a limiter bypass setting circuit is supplied to the gate of this MOSFET Q10. When the internal circuit is operated by a step-down voltage corresponding to the constant voltage VLR, wrinting in the nonvolatile memory elements such as the fuses provided in the limiter bypass setting circuit is not carried out. Therefore, the control signal is set at the high level like that of the power supply voltage VCC and the MOSFET Q10 is turned off.

On the other hand, writing in the nonvolatile memory elements such as the fuses provided in the limiter bypass setting circuit is carried out when the internal circuit is operated by the power supply voltage VCC supplied from the outside instead of the step-down voltage corresponding to the constant voltage VLR. Consequently, the control signal is set at the low level like that of the ground potential of the circuit, and the power switch MOSFET Q10 is turned on, whereby the power supply voltage VCC is supplied via MOSFET Q10 to the internal circuit.

In place of the arrangement above, the output MOSFETs Q7, Q8 constituting the operational amplifier circuit can be allowed to function as power switches. In other words, the gate voltages of the output MOSFETs Q7, Q8 can be forcedly lowered to the low level such as the circuit ground voltage by the signal generated by the melt-cut of the fuse and the like. At this time, it is preferable to suppress wasteful current consumption by switching the potential at the gates of the constant current MOSFETs Q5, Q9 to the ground potential.

The present inventors have paid special attention to the fact that step-down voltage VCL corresponding to the constant voltage VLR is produced in the internal voltage step-down circuit and attempted to set a plurality of operating speed modes in compliance with users' requests by making the constant voltage VLR adjustable.

Figure 18:
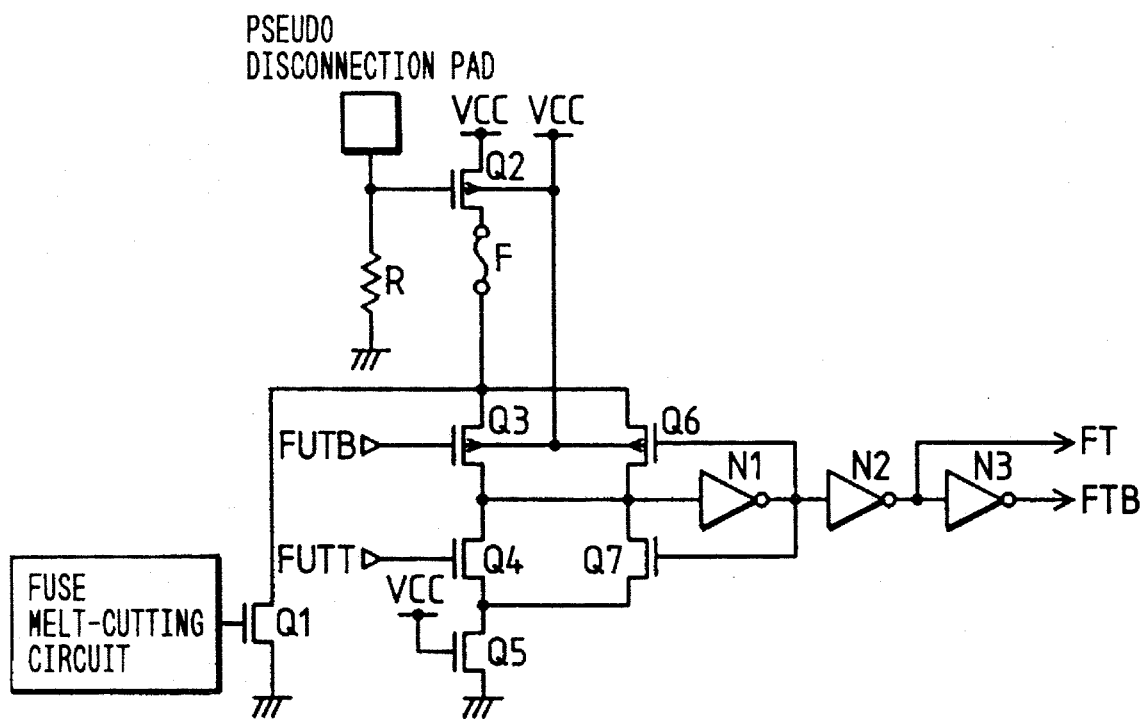
FIG. 18 shows a fuse circuit illustrative of setting the operating speed mode according to the present invention.

FIG. 18 is a diagram showing a fuse circuit for setting the operating speed mode according to the present invention. As shown in FIG. 10, the fuse melt-cutting circuit comprises a logic gate circuit for receiving the mode setting mode signal MS and suitable address signals. The MOSFET Q1 for receiving the output signal of the logic gate circuit at its gate sets up a fuse melt-cutting current. One end of the fuse means F is connected to the drain of the MOSFET Q1, whereas the other end thereof is connected via the P-channel MOSFET Q2 for pseudo-cutting to the power supply voltage VCC.

The gate voltage of the P-channel MOSFET Q2 for pseudo-cutting is set up by a pseudo pad and a pull-down resistor R similar to those described above. In this embodiment, a feedback P-channel MOSFET Q6 and an N-channel MOSFET Q7 are provided in series with respect to the fuse means F so as to prevent DC current from flowing when the information stored in the fuse means F is read out. The connection between the MOSFETs Q6 and Q7 is connected to the input terminal of the inverter N1, and the output signal therefrom is fed back to the MOSFETs Q6 and Q7. In order to take out a voltage signal corresponding to whether or not the fuse means F is cut, the fuse means F is provided with the P-channel MOSFET Q3 and the N-channel MOSFET Q4 in series, and the ground potential of the circuit is supplied to the MOSFETs Q4 and Q7 via the MOSFET Q5 serving as a resistor element when the power supply voltage VCC is supplied to the gates of the FETs Q3 and Q4.

By the one-shot pulse generated when the power is supplied, the signal FUTB supplied to the gate of the P-channel MOSFET Q3 is set at the low level and the signal FUTT supplied to the gate of the N-channel MOSFET Q4 is set at the high level. Consequently, a current path for examining whether or not the fuse means F is cut is formed, and if the fuse means F is not cut, a high-level signal is transmitted to the input of the inverter circuit N1 and the P-channel MOSFET Q6 for receiving the low level output signal is turned on, and further the input signal of the inverter circuit N1 is latched at the high level. If the fuse means F is cut conversely, a low level signal is input to the inverter circuit N1 and the N-channel MOSFET Q7 for receiving the high level output signal is turned on, so that the input signal of the inverter circuit N1 is latched at the low level.

While the P-channel MOSFET Q6 is in the on-state and the output signal of the inverter circuit N1 is set at the low level, the N-channel MOSFET Q7 is in the OFF state and the output signal of the inverter circuit N1 is set at the high level, whereas while the N-channel MOSFET Q7 in the ON-state, the P-channel MOSFET Q6 is turned off. As a result, no current path is formed in the fuse circuit after the MOSFETs Q3 and Q4 are turned off by the signals FUTB and FUTT.

The output signal of the inverter circuit N1 is output as an non-inverted signal FT via the inverter circuit N2 and also output as an inverted signal FTB via the inverter circuits N2 and N3. In other words, the signal FT is set at the high level and FTB at the low level when the fuse means F is cut, whereas when the fuse means F is not cut, the signal FT is set at the low level.

When a high-level voltage such as the power supply voltage VCC is supplied to the pseudo disconnection pad while the fuse means F is not cut, the MOSFET Q2 is turned off and the fuse means F in the non-cut state may spuriously be created. This state is used for the function test in probing when the dynamic RAMs are formed on the semiconductor wafer.

Figure 19:
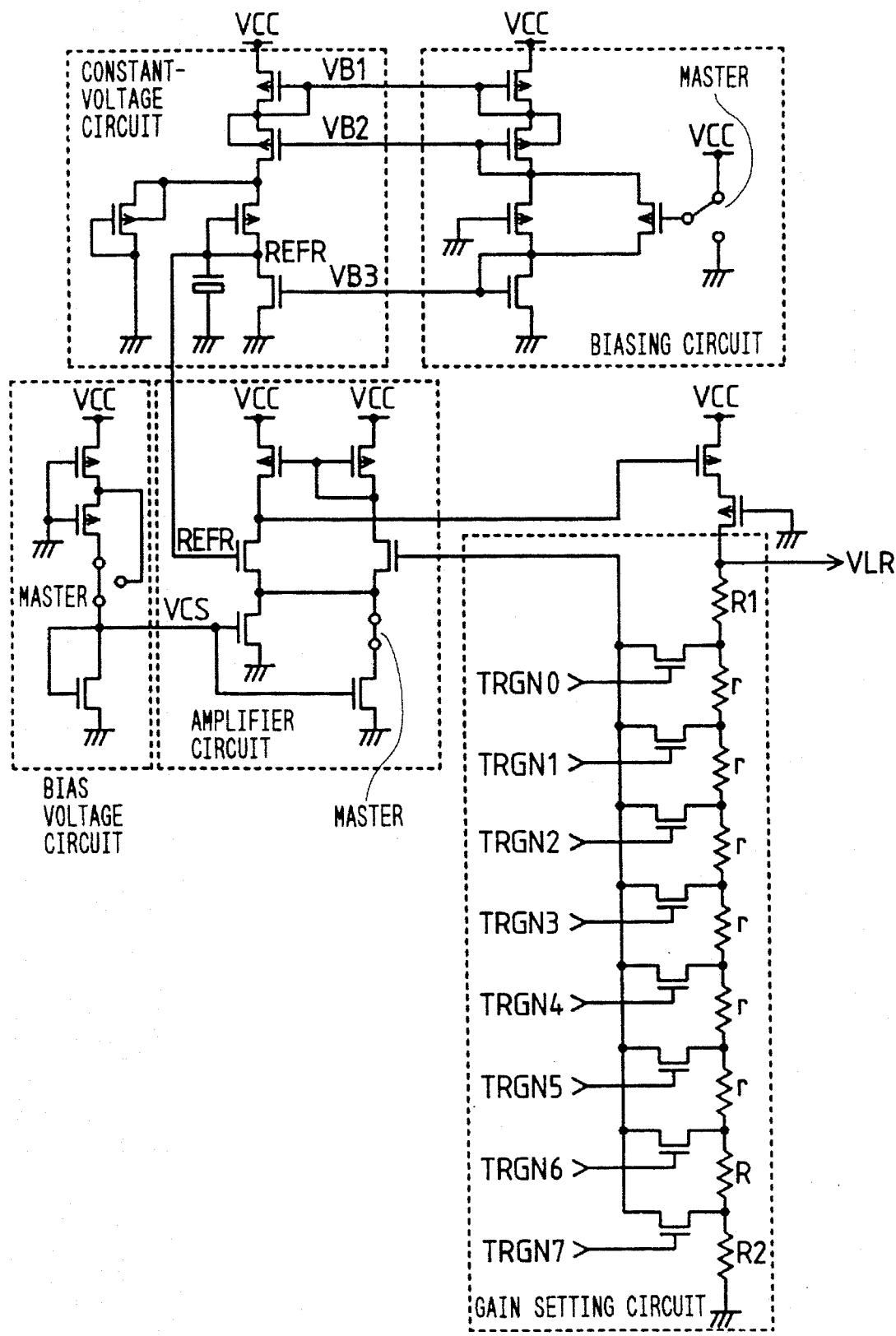
FIG. 19 shows a voltage generating circuit illustrative of generating constant voltage VLR according to the present invention.

FIG. 19 is a diagram showing a voltage generating circuit for generating the constant voltage VLR according to the present invention. The constant voltage circuit sets up the differential voltage REFR between the threshold voltages of two P-channel MOSFETs in the form of diodes. In order to operate the constant voltage circuit, bias voltages VB1 to VB3 generated by a bias circuit are supplied to P-channel and N-channel MOSFETs. The constant voltage circuit sets up a reference voltage REFR at about 1.1 V corresponding to the difference between the threshold voltages of the two P-channel MOSFETs.

An amplifier circuit and a gain setting circuit are provided so as to generate the reference voltage VLR corresponding to the internal step-down voltage at about 3 V using the reference voltage REFR. More specifically, it has been arranged that the desired reference voltage VLR is produced by amplifying the reference voltage REFR in the DC mode. Signals TRGN0 to TRGN7 generaged by decoding the signal generated by the fuse circuit of FIG. 18 are used for the gain setting above. In this embodiment, eight kinds of gain settings are possible. This means eight kinds of differently regulated reference voltages VLR are available.

The internal step-down voltage VCL at about 3.3 V is obtained by using, but not limited to, six TRGN0 to TRGN6 to compensate for process variations such as the reference voltage REFR. On the other hand, signal TRGN7 is used to set a greater gain so as to obtain the reference voltage VLR at as high as 4 V or over as a corresponding regulating resistor like R is set to a greater value.

In the present embodiment, the signals TRGN0 to TRGN6 are generated by the fuse cutting in the common test and used to designate a low-speed mode for compensating process variations. On the other hand, the signal TRGN7 is generated by the fuse cutting signal generated when the mode is set and used when the low-speed mode is switched to the high-speed mode. The switching of the internal voltage makes it possible to select the low-speed operating mode or the high-speed mode despite the fact that the circuit is operated by the same power supply voltage VCC from the outside, the circuit being operated at as low as approximately 3.3 V in the low-speed operating mode and on 4 V or over in the high-speed operating mode.

In addition, signals TRGN0 to TRGN7 may be used to set two operating modes, a low-speed/low power consumption mode in which the internal voltage is 3 V or less and a high-speed mode in which the internal voltage is 4 V or over; or may be used to set three operating modes, a low-speed mode in which the internal voltage is about 2 V, an intermediate speed mode in which the internal voltage is about 3 V and a high-speed mode in which the internal voltage is about 4 V. Further, the circuit of FIG. 17 may be used to add a mode in which the external voltage is employed for operation.

In FIG. 19, the master slice is used so that the bias voltage in the bias circuit, the constant voltage VCS in the bias voltage circuit and the operating current in the differential amplifier circuit can be regulated.

Figure 20:
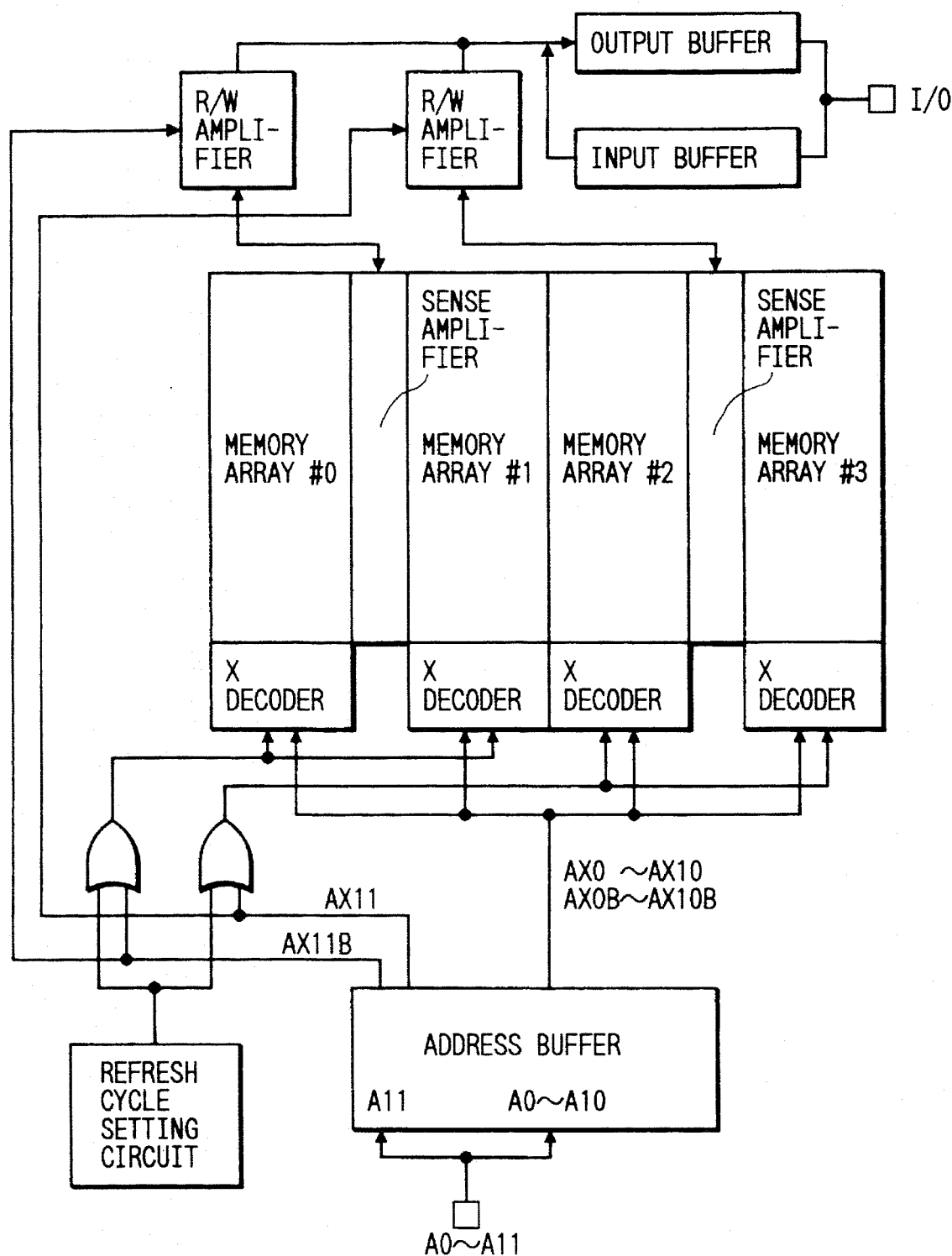
FIG. 20 is a block diagram illustrating the mode of setting the refresh cycle of a dynamic RAM according to the present invention.

FIG. 20 is a block diagram illustrating the refresh cycle setting mode of a dynamic RAM according to the present invention, wherein only a selection circuit of a low-system circuit is shown to explain the refresh operation.

This embodiment is intended for a 16M-bit DRAM, which is not restrictive, and therefore 12-bit address signals A0 to A11 are employed. Therefore, the uppermost-bit address signal A11 and the other address signals A0 to A10 are separately supplied to the internal circuit. Internal address signals AX0 to AX10, AX0B to AX10B corresponding to the address signals A0A10 are supplied to the X decoders which operate to select the word lines of respective four memory arrays #0 to #3. Each X decoder decodes the 11-bit internal address signal and performs a 1/2048 address selecting operation.

The uppermost-bit address signal AX11B is supplied to the X decoders corresponding to the separately provided two memory arrays #0 and #1 via the OR gate circuit controlled by the refresh cycle setting circuit, whereas the address signal AX11 is supplied to the X decoders corresponding to the other two memory arrays #2 and #3 provided separately via the OR gate circuit controlled by the refresh cycle setting circuit.

When the high-level control signal is generated in the refresh cycle setting circuit, depending on whether or not the fuse means is cut as stated above, the address signal A11 is degenerated and 2,048 (2K) refreshments are effeced by means of the address signals A0 to A11. On the other hand, the address signal A11 is made effective by setting the output signal of the refresh cycle setting circuit at the low level and 4,096 (4K) refreshments are effected by the address signals A0 to A11.

If a refresh CBR having a refresh counter or if a refresh function is provided, the output of the refresh counter may be controlled likewise.

FIG. 21 is a timing chart showing a read mode in a high-speed page mode. In the FP read mode, Y-system addresses Y0 to Y10 are taken in by means of the CASB clock signals and output data is obtained in synchronization therewith. In this case, a dynamic RAM having a 16M-bit storage capacity is accessed in units of x4 bits by way of example.

FIG. 22 is a timing chart showing a read mode in a static column mode by way of example. In the SC read mode, the Y-system addresses Y0 to Y10 are appropriately taken in while the CASB signal remains at the low level, and output data is obtained in accordance with address change. In this case, similarly a dynamic RAM having a 16M-bit storage capacity is accessed in units of x4 bits by way of example.

FIG. 23 is a timing chart showing a° read mode in a nibble mode though it is omitted in this embodiment. In this NB read mode, the internal selection circuits are switched one after another to gain continuous access of up to 4 bits by means of CASB clock signals, and output data is obtained in synchronization therewith. In this case, similarly a dynamic RAM having a 16M-bit storage capacity is accessed in units of x4 bits by way of example.

As set forth above, the CASB signal is used to set the operating mode in the above continuous column access mode. For this reason, operating modes are not set simultaneously in one dynamic RAM. As a result, one mode is selectively set as the user desires in line with the mode setting method as stated above.

The present invention as embodied so far has the following effect:

(1) A semiconductor chip provided with a plurality of memory functions including a read or write function and a function selection circuit for selecting one of the memory functions according to the information stored in nonvolatile memory elements is sealed in a package, and memory functions are set finally by writing the nonvolatile memory elements in that state or in a state in which the semiconductor chip is mounted on a board. Therefore, the wafer process up to the assembling step can be made common, and a variety of semiconductor memories having versatile functions can be manufactured with a good efficiency.

(2) On the basis of (1), semiconductor memories having memory functions conforming user specifications can readily be provided.

(3) On the basis of (1) likewise, the quality control over the versatile steps of manufacturing semiconductor memories can simply be exercised because of the common steps up to the assembling work are made common.

(4) Owing to the simple configuration for varying the voltage of the internal circuit generated by the internal step-down voltage circuit, it is possible to develop one type of semiconductor memories into a plurality of types in conformity with user specifications.

(5) Through the procedure of (1), by the method of producing various types of semiconductor memories or memory units using the same the wafer process up to the assembling step, can be made common, and the mass-productibity and the simpler control of production. As a result, semiconductor memories having memory functions conforming to user specifications can be offered in a short time.

Although a description has been given of specific embodiments of the present invention made by the inventors, the invention is not limited to these embodiment thereof but may be modified in various ways without departing the spirit and scope thereof. For example, the refresh period may be selected from among those of 512, 1,024 (1K), 2,048 (2K), 4,096 (4K) and 8,192 (8K) refreshments. With respect to the address space, the X and Y addresses may be made different from each other. In other words, a dynamic RAM having a 16M-bit storage capacity may be arranged so that X and Y are set different like 8K×2K. In the case of 8K×2K bit memory, 13 bits of A0 to A12 are allotted as X addresses and 11 bits of A0 to A10 as Y addresses.

With respect to the nonvolatile memory element for mode setting, use can be made of, other than fuse means, what is electrically written what is written by breaking down elements such as MOSFETs and diodes, or semiconductor memory device such as an EPROM written by injecting electrons into the floating gate, or an anti-fuse whose resistance is lowered by applying current to it.

The semiconductor memory to which the present invention is applied may be what is applied to a static RAM. In the case of a static RAM, its types may be developed into versatile ones mainly different in address and data configuration. Moreover, the present invention may be applied to a flash memory, an FRAM using ferrodielectric substance, a synchronous memory, a memory with a cache memory and the like in the spirit thereof.

The effect attainable by the representative embodiment of the present invention is as follows: A semiconductor chip provided with a plurality of memory functions including a read or write function and a function selection circuit for selecting one of the memory functions according to the information stored in nonvolatile memory elements is sealed in a package, and the memory function is set finally by writing the nonvolatile memory elements in that state or in a state in which the semiconductor chip is mounted on a board. Therefore, the semiconductor memories having versatile functions and those of different kinds can be manufactured with efficiency and offered to users for a short period of time.

What is claimed is:

1. A dynamic random access memory comprising:

a semiconductor chip;

a package within which said semiconductor chip is sealed;

a memory array formed on the semiconductor chip, said memory array including:

a plurality of data lines, a plurality of word lines and a plurality of dynamic memory cells each of which is coupled to a corresponding one of said plurality of data lines and a corresponding one of said plurality of word lines;

a mode setting signal storing circuit formed on the semiconductor chip, said mode setting signal storing circuit including a plurality of nonvolatile memory elements for storing information relating to a plurality of operation modes of said dynamic random access memory, said mode setting signal storing circuit outputting a plurality of mode setting signals, said information relating to said plurality of operation modes of said dynamic random access memory being written to said nonvolatile memory elements after the semiconductor chip is sealed in the package; and a selection circuit formed on the semiconductor chip, said selection circuit receives said plurality of mode setting signals and selects one of said operation modes of said dynamic random access memory based on said mode setting signals.

2. A dynamic random access memory according to claim 1, wherein
said plurality of operation modes of said dynamic random access memory include a first mode and a second mode, and
said dynamic random access memory is accessible in a unit of a first number of bits when said dynamic random access memory is operating in said first mode and is accessible in a unit of a second number of bits when said dynamic random access memory is operating in said second mode, said first number of bits being different from said second number of bits.

3. A dynamic random access memory according to claim 1, wherein
said plurality of operation modes of said dynamic random access memory includes a first mode and a second mode; and
said dynamic random access memory is accessible in a unit comprising one bit when said dynamic random access memory is operating in said first mode and is accessible in a unit comprising a first plurality number of bits when said dynamic random access memory is operating in said second mode.

4. A dynamic random access memory according to claim 3, wherein
said plurality of operation modes of said dynamic random access memory further includes a third mode; and
said dynamic random access memory is accessible in a unit comprising a second plurality number of bits when said dynamic random access memory is operating in said third mode, said first plurality number of bits being different from said second plurality number of bits.

5. A method of forming a dynamic random access memory, said method comprising successive steps of:
(1) forming a memory array and a mode setting circuit on a semiconductor chip, said memory array comprising a plurality of data lines, a plurality of word lines, and a plurality of dynamic memory cells each of which is coupled to a corresponding one of said plurality of data lines and a corresponding one of said plurality of word lines, said mode setting circuit including a nonvolatile memory element;
(2) sealing said semiconductor chip in a package; and
(3) writing information relating to a plurality of operation modes of said dynamic random access memory into said nonvolatile memory element so that said mode setting circuit sets one of the plurality of operation modes of said dynamic random access memory based on said information written into said nonvolatile memory element.

6. A method of forming a dynamic random access memory according to claim 5 further comprising a step of:
performing a burn-in test for said dynamic random access memory, said performing step being executed after said sealing step (2) and before said writing step (3).

7. A method of forming a dynamic random access memory according to claim 6 further comprising, after step (3), a step of:
writing information relating to said plurality of operation modes of said dynamic random access memory to said package.

8. A method of forming a dynamic random access memory according to claim 7, wherein each of said nonvolatile memory elements includes a fuse.

9. A dynamic random access memory according to claim 1, wherein said plurality of operation modes of said dynamic random access memory includes a first data line selecting mode and a second data line selecting mode.

10. A dynamic random access memory according to claim 9, wherein said first data line selecting mode includes a high-speed page mode and said second data line selecting mode includes a static column mode.

11. A dynamic random access memory according to claim 10, wherein said plurality of operation modes of said dynamic random access memory further includes a nibble mode.

12. A dynamic random access memory according to claim 1, wherein:
said plurality of operation modes of said dynamic random access memory further includes a first mode and a second mode;
a first number of memory cells of said plurality of dynamic memory cells are each refreshed at once when said dynamic random access memory operates in said first mode; and
a second number of memory cells of said plurality of dynamic memory cells are each refreshed at a time when said dynamic random access memory operates in said second mode, said first number of memory cells being different from said second number of memory cells.

13. A dynamic random access memory according to claim 12, wherein said first mode includes a 2K refresh mode and said second mode includes a 4K refresh mode.

14. A dynamic random access memory comprising:
a semiconductor chip;
a memory array formed on the semiconductor chip, said memory array including (i) a plurality of data lines, (ii) a plurality of word lines, and (iii) a plurality of dynamic memory cells each of which is coupled to a corresponding one of said plurality of data lines and a corresponding one of said plurality of word lines;
a package within which the semiconductor chip is sealed;
a voltage setting signal storing circuit formed on the semiconductor chip, said voltage setting signal storing circuit including a plurality of nonvolatile memory elements for storing information relating to voltage settings, said voltage setting signal storing circuit outputting a plurality of voltage setting signals, said information being written into said nonvolatile memory elements after the semiconductor chip is sealed in the package;
a voltage generating circuit formed on the semiconductor chip, said voltage generating circuit receiving said plurality of voltage setting signals and outputting (i) a first voltage in response to said plurality of voltage setting signals being of a first state and (ii) a second voltage in response to said plurality of voltage setting signals being of a second state, said first state being different from said second state, and said first voltage being different from said second voltage.

15. A dynamic random access memory according to claim 14, wherein each of said nonvolatile memory elements includes a fuse.

* * * * *